(12) United States Patent
Nakazaki et al.

(10) Patent No.: US 7,485,505 B2
(45) Date of Patent: Feb. 3, 2009

(54) THIN-FILM TRANSISTOR, METHOD FOR MANUFACTURING THIN-FILM TRANSISTOR, AND DISPLAY USING THIN-FILM TRANSISTORS

(75) Inventors: Yoshiaki Nakazaki, Saitama (JP); Genshiro Kawachi, Chiba (JP); Terunori Warabisako, Nishitama-gun (JP); Masakiyo Matsumura, Kamakura (JP)

(73) Assignee: Advanced LCD Technologies Development Center Co., Ltd., Yokohama-shi (JP)

( * ) Notice: Subject to any disclaimer, the term of this patent is extended or adjusted under 35 U.S.C. 154(b) by 0 days.

(21) Appl. No.: 11/855,755

(22) Filed: Sep. 14, 2007

(65) Prior Publication Data
US 2008/0044975 A1 Feb. 21, 2008

Related U.S. Application Data

(62) Division of application No. 11/428,477, filed on Jul. 3, 2006, now Pat. No. 7,288,787.

(30) Foreign Application Priority Data
Jul. 5, 2005 (JP) ............................. 2005-195781
Jul. 5, 2005 (JP) ............................. 2005-196859

(51) Int. Cl.
*H01L 21/84* (2006.01)
(52) U.S. Cl. ...................... 438/149; 438/151; 438/166
(58) Field of Classification Search ................ 438/149, 438/150, 154, 163, 164, 166, 308, 486, 487
See application file for complete search history.

(56) References Cited

U.S. PATENT DOCUMENTS

| 5,759,879 | A | 6/1998 | Iwasaki |
| 6,482,684 | B1 | 11/2002 | Yamazaki |
| 6,737,673 | B2 | 5/2004 | Yamazaki |
| 7,148,507 | B2 * | 12/2006 | Isobe et al. ................... 257/64 |

(Continued)

FOREIGN PATENT DOCUMENTS

EP    1 047 119 A2    10/2000

(Continued)

OTHER PUBLICATIONS

Masakiyo Matsumura, "Preparation of Ultra-Large Grain Silicon Thin-Films by Excimer-Laser", Journal of the Surface Science Society of Japan, vol. 21, No. 5, May 2000, pp. 278-287.

(Continued)

*Primary Examiner*—Kevin M Picardat
(74) *Attorney, Agent, or Firm*—Oblon, Spivak, McClelland, Maier & Neustadt, P.C.

(57) ABSTRACT

The present invention provides a thin-film transistor offering a higher electron (or hole) mobility, a method for manufacturing the thin-film transistor, and a display using the thin-film transistor. The present invention provides a thin-film transistor having a source region, a channel region, and a drain region in a semiconductor thin film with a crystal grown in a horizontal direction, the thin-film transistor having a gate insulating film and a gate electrode over the channel region, wherein a drain edge of the drain region which is adjacent to the channel region is formed in the vicinity of a crystal growth end position.

10 Claims, 16 Drawing Sheets

U.S. PATENT DOCUMENTS

| | | | |
|---|---|---|---|
| 7,226,817 B2 * | 6/2007 | Tanada et al. | 438/149 |
| 2002/0058399 A1 | 5/2002 | Sato et al. | |
| 2005/0104125 A1 | 5/2005 | Sato et al. | |

FOREIGN PATENT DOCUMENTS

| | | |
|---|---|---|
| JP | 2002-83768 | 3/2002 |
| JP | 2002-83769 | 3/2002 |

OTHER PUBLICATIONS

Masakiyo Matsumura, "Method of Forming Large Crystal Grain Si Film by Excimer Laser Light Irradiation", Applied Physics, vol. 71, No. 5, 2000, pp. 543-547.

* cited by examiner

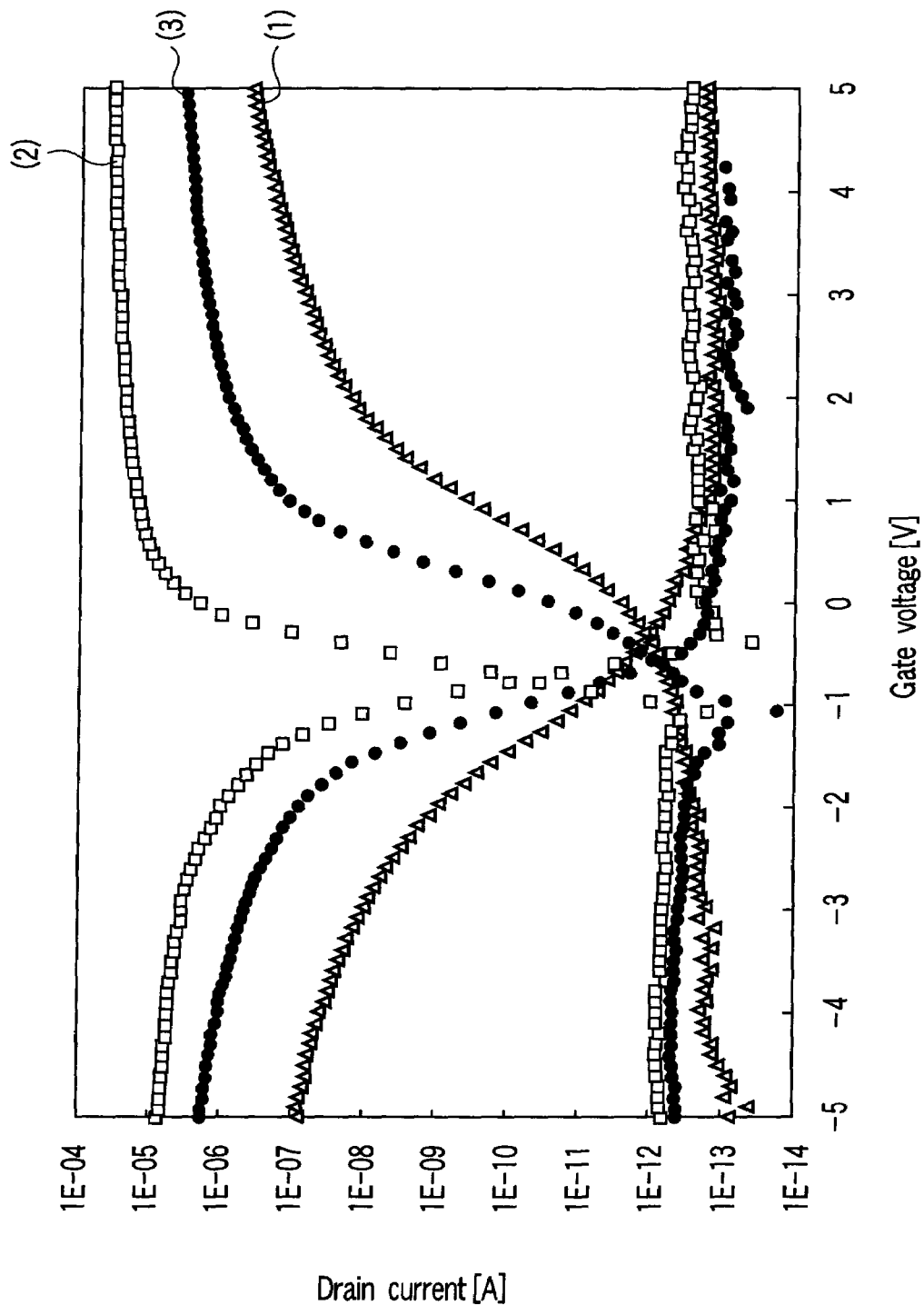
F I G. 15

THIN-FILM TRANSISTOR, METHOD FOR MANUFACTURING THIN-FILM TRANSISTOR, AND DISPLAY USING THIN-FILM TRANSISTORS

CROSS-REFERENCE TO RELATED APPLICATIONS

This application is a divisional of application Ser. No. 11/428,477 filed Jul. 3, 2006 which is based upon and claims the benefit of priority from prior Japanese Patent Applications No. 2005-195781, filed Jul. 5, 2005; and No. 2005-196859, filed Jul. 5, 2005, the entire contents of both of which are incorporated herein by reference.

BACKGROUND OF THE INVENTION

1. Field of the Invention

The present invention relates to the structure of an n- or p-channel type thin-film transistor, a method for manufacturing an n- or p-channel type thin-film transistor, and a display using such thin-film transistors.

2. Description of the Related Art

Amorphous silicon thin films and polysilicon thin films have been used as semiconductor thin films used to form, for example, thin-film transistors (TFTs) serving as switching elements that control voltages applied to pixels in a liquid crystal display (LCD) or thin-film transistors for a control circuit for the liquid crystal display.

In TFTs using polysilicon thin films as semiconductor thin films, electrons or holes migrating through a channel region generally have a higher mobility than in TFTs using amorphous silicon thin films as semiconductor thin films. Accordingly, the transistors using polysilicon thin films have higher switching speeds and can thus operate faster, than the transistors using amorphous silicon thin films.

This enables TFTs to be used to form an LCD pixel selection circuit and a peripheral drive circuit to be formed on the same substrate on which pixel control thin-film transistors are formed, the peripheral drive circuit driving an LCD. Further, the design margin of other parts can be advantageously increased. A cost and size reduction and an increased definition can also be achieved by incorporating the peripheral drive circuit such as a driver circuit or DAC into a display section including the pixel control thin-film transistors.

The present applicant has developed a mass production technique for stably manufacturing a large-grain-size crystallization region in a non-single-crystal semiconductor thin film formed on an insulating substrate. As a method for forming a large-grain-size crystallization region, crystallization methods have been proposed in, for example, "Method for Forming Giant Crystal Grain Si Film Using Excimer Laser", Masakiyo MATSUMURA, Surface Science, Vol. 21, No. 5, pp. 278 to 287, 2000, and "Method for Forming Giant Crystal Grain Si Film Using Excimer Laser Light Irradiation", Masakiyo MATSUMURA, Applied Physics, Vol. 71, No. 5, pp. 543 to 547, 2000. Successful mass production of a large-grain-size crystallization region enables not only the liquid crystal display section and switching transistors for the pixels but also a memory circuit such as DRAM or SRAM, an arithmetic and logic circuit, or the like to be formed on a glass substrate. This enables a reduction in the amount of power required by the entire liquid crystal display and its size.

The present inventor et al. have developed a manufacture technique for forming higher-performance TFTs that offer practical, optimum transistor characteristics. For example, a single-crystal silicon having a crystal with a large grain size grown by executing a thermal treatment on an amorphous silicon thin film has a surface different from that of a single-crystal silicon wafer formed by slicing a single-crystal rod formed by a normal lift-off method. Specifically, the former single-crystal silicon has a thin film that is not microscopically flat and has a complicated grain boundary generated during crystal growth.

It has thus been found that a desired off-current characteristic is not obtained simply by forming a TFT at an arbitrary portion in the crystallization region. It has also been found that a desired mobility transistor is not obtained.

The present invention is intended to solve the problem of the degraded transistor characteristics to provide a TFT structure offering the optimum off-current and mobility characteristics, a method for manufacturing such a TFT, and a display using such a TFT.

BRIEF SUMMARY OF THE INVENTION

An object of the present invention is to provide a thin-film transistor structure offering optimum transistor characteristics, a method for manufacturing such a thin-film transistor, and a display using such a thin-film transistor.

A thin-film transistor described in an embodiment of the present invention is an n-channel type thin-film transistor having a source region, a channel region, and a drain region in a semiconductor thin film having a crystallization region with a crystal grown in a horizontal direction, the thin-film transistor having a gate insulating film and a gate electrode over the channel region, the thin-film transistor characterized in that a channel region side edge of a drain or source region is provided in the crystallization region within about 1.0 μm from the crystal growth start position or vertical growth start position, or about 2.0 to 3.8 μm or about 4.6 to 5.0 μm away from the crystal growth start position.

A thin-film transistor described in an embodiment of the present invention is an n-channel type thin-film transistor having a source region, a channel region, and a drain region in a semiconductor thin film having a crystallization region with a crystal grown in a horizontal direction and, the crystallization region having an inclined surface which rises in the crystal growth direction, the thin-film transistor having a gate insulating film and a gate electrode over the channel region, the thin-film transistor characterized in that a channel region side edge of a drain or source region is provided in the crystallization region within about 1.0 μm from the crystal growth start position, or about 2.0 to 3.8 μm or about 4.6 to 5.0 μm away from the crystal growth start position.

A thin-film transistor described in an embodiment of the present invention is a p-channel type thin-film transistor having a source region, a channel region, and a drain region in a semiconductor thin film having a crystallization region with a crystal grown in a horizontal direction, the thin-film transistor having a gate insulating film and a gate electrode over the channel region, the thin-film transistor characterized in that a channel region side edge of a drain or source region is provided in the crystallization region 0.7 to 2.6 μm or 3.1 to 4.5 μm away from the crystal growth start position or vertical growth start position.

A thin-film transistor described in an embodiment of the present invention is a p-channel type thin-film transistor having a source region, a channel region, and a drain region in a semiconductor thin film having a crystallization region with a crystal grown in a horizontal direction and, the crystallization region having an inclined surface which rises in the crystal growth direction, the thin-film transistor having a gate insulating film and a gate electrode over the channel region, the thin-film transistor characterized in that a channel region side edge of a drain or source region is provided in the crystallization region 0.7 to 2.6 µm or 3.1 to 4.5 µm away from the crystal growth start position or vertical growth start position.

A method for manufacturing a thin-film transistor according to an embodiment of the present invention is a method for manufacturing an n-channel type thin-film transistor, the method characterized by comprising a step of irradiating a non-single-crystal semiconductor film with laser light having a reverse peak-like light intensity distribution to crystallize an irradiated region to form a crystallization region, and a step of forming a thin-film transistor by positioning a side edge of a drain or source region which is adjacent to a channel region, in the crystallization region within about 1.0 µm from the crystal growth start position or vertical growth start position, or about 2.0 to 3.8 µm or about 4.6 to 5.0 µm away from the crystal growth start position.

A method for manufacturing a thin-film transistor according to an embodiment of the present invention is a method for manufacturing a p-channel type thin-film transistor, the method characterized by comprising a step of irradiating a non-single-crystal semiconductor film with laser light having a reverse peak-like light intensity distribution to crystallize an irradiated region to form a crystallization region, and a step of forming a thin-film transistor by positioning a side edge of a drain or source region which is adjacent to a channel region, in the crystallization region 0.7 to 2.6 µm or 3.1 to 4.5 µm away from the crystal growth start position or vertical growth start position.

A display described in an embodiment of the present invention has the above thin-film transistor provided in a peripheral circuit section which includes a signal and scan line drive circuits and which needs to operate at high speed.

The present invention provides an n-channel type TFT offering an optimum off-current characteristic, a method for manufacturing the n-channel type TFT, and a display using the n-channel type TFT. The present invention also provides a p-channel type TFT offering an optimum hole mobility, a method for manufacturing the p-channel type TFT, and a display using the p-channel type TFT.

BRIEF DESCRIPTION OF THE SEVERAL VIEWS OF THE DRAWING

FIG. 15 is a diagram showing the drain current vs. gate voltage in a plurality of thin-film transistors having respective drain edges formed at different positions;

DETAILED DESCRIPTION OF THE INVENTION

An embodiment of the present invention will be described below with reference to the drawings. The description below relates to one embodiment of the present invention and is intended to illustrate the general principle of the present invention. Accordingly, the description is not intended to limit the present invention to this embodiment section or to the configurations specifically shown in the accompanying drawings. In the following detailed description and the drawings, similar elements are denoted by similar reference number.

The present inventor has developed and applied for a patent on a technique for manufacturing a p- or n-channel type TFT by aligning a drain or source edge with the vicinity of a crystal growth end position, as means for providing an optimum mobility characteristic for a crystallization region with a crystal grown in a horizontal direction. To form as many TFTs as possible in a large-grain-size crystallization region with a crystal grown in the horizontal direction, the present inventor wholeheartedly studied the transistor characteristics, that is, the off-current characteristic for a drain current and the mobility characteristic, of the crystallization region in the vicinity of a crystal growth start position. As a result, with respect to a position where the drain edge of the TFT is formed, the present inventor has found an appropriate region offering the optimum transistor characteristics.

In a first embodiment, an n-channel type TFT is formed in a crystallization region with a crystal grown in a horizontal direction. In this case, the optimum off-current characteristic is obtained by forming an n-channel type TFT so that a channel region side edge of a drain or source region of the TFT is located in the crystallization region at a position that does not correspond to the vicinity of a crystal growth start position or vertical growth start position, for example, within about 1.7 µm from the crystal growth start position or vertical growth start position, or about 2.4 to 4.6 µm or about 4.9 to 5.5 µm away from the crystal growth start position.

In another embodiment, the optimum off-current characteristic is obtained by forming an n-channel type TFT so that a channel region side edge of a drain or source region of the TFT is located in the crystallization region at a position that does not correspond to the vicinity of a crystal growth start position or vertical growth start position, for example, within about 1.0 µm from the crystal growth start position or vertical growth start position, or about 2.0 to 3.8 µm or about 4.6 to 5.0 µm away from the crystal growth start position.

Figure 1:
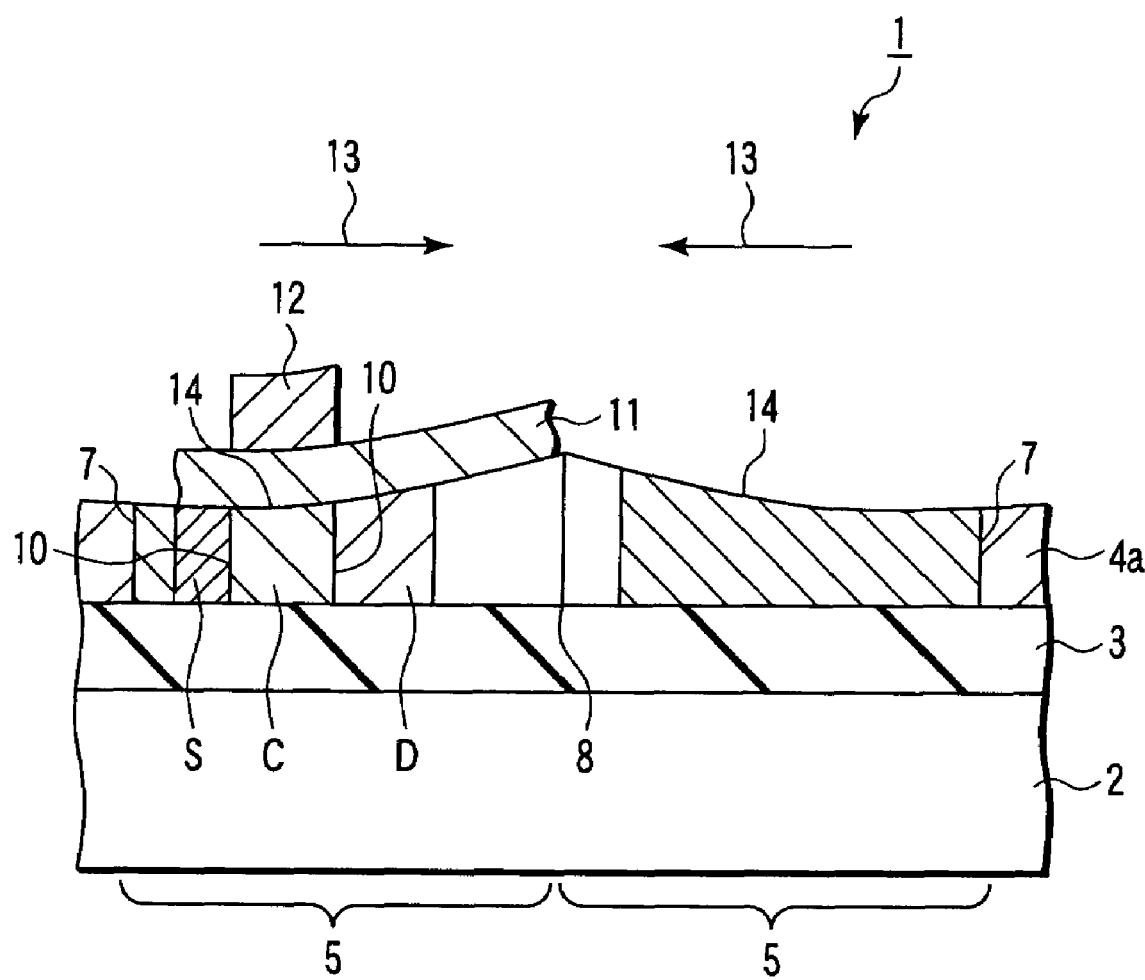
FIG. 1 is a partly cutaway sectional view illustrating the configuration of an n- or p-channel type thin-film transistor according to the present invention.

In a second embodiment, a p-channel type TFT is formed in a crystallization region with a crystal grown in the horizontal direction. In this case, the optimum mobility characteristic is obtained by forming a p-channel type TFT so that a channel region side edge of a drain or source region of the TFT is located in the crystallization region 0.7 to 2.6 µm or 3.1 to 4.5 µm away from a crystal growth start position or vertical growth start position, for example, at least 2.3 µm away from the crystal growth start position or vertical growth start position First, with reference to FIG. 1, description will be given of the thin-film transistors according to the first and second embodiment of the present invention. The first and second embodiments relate to the different channel types, n and p, but have a common structure. FIG. 1 is an enlarged sectional view showing a region in which these thin-film transistors are formed. The first and second embodiments have common characteristics described below.

In a light irradiated region of a non-single-crystal semiconductor layer, a crystallization region (5; (7-S-C-D-8)) is formed by crystal growth in the horizontal direction. The crystallization region 5 is shaped so that crystal growth progresses in the horizontal direction from a crystal growth start position 7, with the crystal rising maximally at a crystal growth end position 8. A non-single-crystal semiconductor layer, for example, an amorphous silicon film 4 (see FIG. 7), is irradiated with light to cause crystal growth in the horizontal direction to form a crystallized crystallization region 5. The crystallization region 5 is, for example, a silicon film in which a crystal grows in a crystal growth direction 13 from the crystal growth start position 7. The crystallization region 5 has an inclined surface having a film thickness increasing toward the crystal growth end position 8. In this crystallization region 5, the mobility (µmax) of electrons or holes in the channel region increases in the crystal growth direction 13 of the TFT and significantly in the vicinity of the crystal growth end portion 8.

A large number of fine crystal grains are distributed in the vicinity of the crystal growth start position 7. The present inventor has thus found that it is not desirable that the TFT be formed by aligning its drain edge with the vicinity of the crystal growth start position 7. In other words, the transistor mobility is undesirably degraded by forming the TFT by aligning its drain edge with the vicinity of the crystal growth start position 7.

A TFT according to the embodiments of the present invention is made taking the above nature into account. Specifically, with the above crystallization region, the TFT is located and formed in the crystallization region 0.7 to 2.6 µm or 3.1 to 4.5 µm away from the crystal growth start position or vertical growth start position. It has been found that this configuration enables the electron or hole mobility (µmax) to be maximized at the above positions.

In the light irradiated region of the non-single-crystal semiconductor layer, the crystallization region 5 is formed by crystal growth in the horizontal direction; in the crystallization region 5, a crystal grows in the horizontal direction from the crystal growth start position 7. The crystallization region 5 is a semiconductor thin film having an inclined surface 14 that rises toward the crystal growth end position 8. In other words, the crystallization region 5 is a semiconductor thin film having the inclined surface with a film thickness increasing monotonously in the horizontal direction from the crystal growth start position.

Although the reason is not clear, a laser has a significant fluence at the edge 8 of the raised portion, where the terminal of the crystallization region 5 having grown from the right side of FIG. 1 collides against the terminal of the crystallization region 5 having grown from the left side of FIG. 1. This results in a high film stress and abrasion in this region. This is expected to degrade characteristics such as mobility. The channel region side edge of the drain or source region is located in the crystallization region at a position that does not correspond to the vicinity of the crystal growth start position 7. On the other hand, the channel region side edge of the drain or source region is preferably located in the vicinity of peak of the inclined surface with the monotonously increasing film thickness. The non-single-crystal semiconductor film is, for example, a polycrystal film such as Si or an amorphous film.

Now, with reference to FIG. 1, description will be given of an example of specific configuration of an n- or p-channel type TFT driving a liquid crystal display. The TFT 1 in FIG. 1 has a top gate type thin-film transistor structure. A substrate 2 may be an insulator or a semiconductor or metal substrate having an insulating film formed on its surface. An insulating film, for example, a silicon oxide film 3, is provided on the insulating substrate, for example, the glass substrate 2. The silicon oxide film 3 is, for example, a CVD film or thermal oxide film and has a thickness of for example, 1 µm. A non-single-crystal semiconductor film, for example, an amorphous silicon film 4, is provided on the silicon oxide film 3. The amorphous silicon film 4 has a thickness of 30 to 300 nm, more specifically, for example, 200 nm. The amorphous silicon film is deposited by, for example, plasma CVD.

The crystallization region 5 is formed in the entire amorphous silicon film 4 or its predetermined region. FIG. 1 shows two crystallization regions 5. The crystallization regions 5 have a light intensity distribution like a reverse peak pattern as shown at L in FIG. 7(b). The crystallization region 5 is crystallized by irradiation with a light beam having energy sufficient to melt the amorphous silicon film 4, for example, KrF excimer laser light.

In the crystallization region 5 crystallized by laser light having a plurality of light intensity distributions like reverse peak patterns, crystal growth progresses with the film thickness sequentially increasing in the horizontal direction from the crystal growth start position 7. The crystallization region 5 has a sectional shape corresponding to the crystallized and raised single-crystal silicon film, in the vicinity of the crystal growth end position 8.

In the crystallization region 5 crystallized by laser light having a plurality of light intensity distributions like reverse peak patterns, crystals collide against each other at adjacent positive peak portions P (see FIG. 7(b)), that is, the crystallized crystal growth end positions 8. This results in an angled sectional shape corresponding to the raised silicon film. In the present specification, a semiconductor film with its predetermined position crystallized is defined as a semiconductor thin film 4a. The length between the crystal growth start position 7 and the crystal growth end position 8 is determined by the pulse width of the reverse peak-like light intensity distribution in FIG. 7(b).

In this embodiment, the TFT 1 is formed by placing the drain or source edge of a channel region C of the TFT 1 in the crystallization region 5 at a position that does not correspond to the vicinity of the crystal growth start position 7 or vertical growth start position.

For example, the n-channel type TFT according to the first embodiment is formed by placing the drain edge 10 (side end 10) of the channel region C of the TFT 1 in the crystallization region within 0.7 μm from the crystal growth start position or about 2.0 to 3.8 μm or about 4.6 to 5.0 μm away from the crystal growth start position, for example, within about 2.3 μm from the crystal growth start position. The channel region C is formed adjacent to the drain region D, with the source region S adjacent to the channel region C.

In another embodiment, the n-channel type TFT according to the first embodiment is formed by placing the drain edge 10 (side end 10) of the channel region C of the TFT 1 in the crystallization region within 1.0 μm from the crystal growth start position or about 2.0 to 3.8 μm or about 4.6 to 5.0 μm away from the crystal growth start position, for example, within about 2.3 μm from the crystal growth start position. The channel region C is formed adjacent to the drain region D, with the source region S adjacent to the channel region C.

For example, the p-channel type TFT according to the second embodiment is formed by placing the drain edge 10 (side end 10) of the channel region C of the TFT 1 in the crystallization region at least 2.3 μm away from the crystal growth start position 7. The channel region C is formed adjacent to the drain region D, with the source region S adjacent to the channel region C.

A gate insulating film 11, for example, a silicon oxide film, is provided on the channel region C so as to align with it. The silicon oxide film may be an oxide film formed by a direct-oxidation low-temperature process based on microwave heating CVD at 300 to 400° C., for example, 350° C.

A gate electrode 12 is provided on the gate insulating film 11 so as to align with the channel region C. The TFT 1 is thus manufactured. In the present specification, the TFT is an element having a TFT structure and may be used not only as a transistor but also for a memory, a capacitor, or a resistor.

Now, with reference to the process diagram in FIG. 2, description will be given of an example of a method for manufacturing the n- or p-channel TFT 1. The same components as those in FIG. 1 are denoted by the same reference numerals. Their detailed description is omitted to avoid duplication.

First, a crystallizing substrate is manufactured. For example, a quartz substrate or a glass substrate 2 consisting of no alkali glass is conveyed to a plasma CVD apparatus. The glass substrate 2 is placed and installed at a predetermined position in the plasma CVD apparatus (step-1). An underlayer insulating film, for example, a silicon oxide film 3, is subsequently grown in a vapor phase by plasma CVD (step-2). The plasma CVD can be carried out, for example, at a substrate temperature of 500° C. and a deposition time of 40 minutes.

Then, a non-single-crystal semiconductor film consisting of amorphous silicon or polycrystal silicon to be crystallized is grown in a vapor phase by plasma CVD (step-3); the non-single-crystal semiconductor film is an amorphous silicon film 4 of film thickness 30 to 300 nm (for example, about 200 nm). The amorphous silicon film 4 is deposited on the silicon oxide film 3 by, for example, LP-CVD (Lower Pressure CVD). The amorphous silicon film 4 (a-Si) has a thickness of for example, 200 nm. The LP-CVD process is executed, for example, in an $Si_2H_6$ atmosphere under conditions including a flow rate of 150 sccm, a pressure of 8 Pa, a substrate temperature of 450° C., and a deposition time of 35 minutes. In this case, the LP-CVD process is used, but instead, for example, a PE-CVD (low-temperature plasma CVD) process may be used.

The non-single-crystal semiconductor thin film is not limited to the amorphous silicon film 4 (Si). For example, a thin film such as Ge or SiGe may be used. Further, the deposition of the non-single-crystal semiconductor thin film is not limited to the CVD process. For example, the deposition may be carried out using a sputtering apparatus.

Then, to form a large-grain-size crystallization region, a cap film through which incident light can be transmitted, for example, a silicon oxide film is deposited on the amorphous silicon film 4 to a film thickness of 10 to 100 nm, for example, 10 nm, by plasma CVD. The silicon oxide film is deposited on the amorphous silicon film 4 at a substrate temperature of 500° C. and a deposition time of 10 minutes by, for example, the LP-CVD process. The cap film consists of an insulating film and exerts a heat storage effect. The cap film reduces the rate of a decrease in the temperature of the non-single-crystal semiconductor thin film 2 when crystallization is carried out using laser light in the subsequent step. A crystallizing cap film is thus manufactured (step-4).

Crystallizing steps 5 and 6 are then executed. The crystallizing substrate 2 is located and installed at a predetermined position in a crystallization apparatus. A crystallization position in the crystallizing substrate conveyed to the crystallization apparatus is irradiated with pulse-like excimer laser light having a light intensity distribution like a reverse peak pattern as shown in FIG. 7(b). The irradiated region is heated and melted (step-5).

This temperature distribution causes heat to be stored in the cap film 35. Blocking the excimer laser light lowers the temperature of the melted semiconductor film in accordance with a temperature gradient corresponding to a light intensity distribution such as the one shown in FIG. 9(b). With this temperature increase process, the temperature lowers slowly owing to the heat storage effect of the cap film. Thus, crystal growth sequentially occurs in association with the temperature gradient to form a crystallization region 5 in which a large-grain-size crystal is formed (step-6). The excimer laser light may be, for example, KrF excimer laser light and may have an energy density of for example, 350 mJ/cm². Positional information for crystallization is pre-stored in a computer (not shown). The computer automatically sequentially moves and places the substrate at the crystallization position in the crystallizing substrate, and then irradiates the substrate with laser light for crystallization to finish the crystallization steps 5 and 6.

The crystallization steps 5 and 6 use a phase modulation excimer laser crystallization method described later in detail. In this case, the surface of the cap film is irradiated with excimer laser light having a reverse peak-like light intensity distribution R (see FIG. 7(b)). The pulse laser light irradiation melts that region of the amorphous silicon film 4 which has been irradiated with laser light. The temperature of the melted region lowers while the laser light is blocked. The solidification position moves in the horizontal direction to cause sequential crystal growth to form a crystallization region 5.

In the crystallization region 5, crystal growth progresses in the horizontal direction from the crystal growth start position 7 as shown in FIG. 1. The distance from the crystal growth start position 7 to the crystal growth end position 8 is 5.0 μm in the n-channel type according to the first embodiment. The distance is 5.0 μm in the example of a p-channel type according to the second embodiment. The crystal growth converts the amorphous silicon film 4 into a partly or entirely crystallized semiconductor thin film 4a. Pulse laser light irradiation may be carried out once or a number of times. Alternatively, pulse laser light irradiation may be combined with irradiation with another light source, for example, flash lamp light.

The crystallization region 5 thus formed is normally shaped so that crystal growth progresses in the horizontal direction from the crystal growth start position 7, with the crystal rising at the crystal growth end position 8, as shown in FIG. 1.

Then, to form the TFT 1 in the large-grain-size crystallization region, the silicon oxide film is removed from the deposited cap film (step-7). The silicon oxide film can be removed by a dry etching process. For example, $BCl_3$ or $CH_4$ may be used as an etching gas for the dry etching process.

A TFT manufacturing process is then executed on the glass substrate 2 on which the crystallization process has been finished. For example, the n-channel type TFT according to the first embodiment is manufactured so that the channel region side edge of the drain or source region of the TFT is placed in the crystallization region within 0.7 μm from the crystal growth start position 7 or vertical growth start position, or about 2.0 to 3.8 μm or about 4.6 to 5.0 μm away from the crystal growth start position.

In another embodiment, the n-channel type TFT according to the first embodiment is manufactured so that the channel region side edge of the drain or source region of the TFT is placed in the crystallization region within 1.0 μm from the crystal growth start position 7 or vertical growth start position, or about 2.0 to 3.8 μm or about 4.6 to 5.0 μm away from the crystal growth start position.

The p-channel type TFT according to the second embodiment is manufactured so that the channel region side edge of the drain or source region of the TFT is placed in the crystallization region 2.3 μm away from the crystal growth start position or vertical growth start position.

In the present specification, the crystal growth start position or vertical growth start position is a position in a crystallized single-crystal region where crystal growth starts as shown in FIG. 7(c). At the crystal growth start position 7, fine crystal grains gather in a crystal growth start part. The crystal growth start position 7 is a single-crystal growth start position that does not correspond to the fine crystal grain part. The channel region side edge of the drain or source region of the TFT is the edge of the drain or source located at the boundary position between the channel region and the drain or source region that is in contact with the channel region.

Then, the glass substrate 2 having the crystallized semiconductor thin film is conveyed to a predetermined position in a plasma CVD apparatus (not shown) and placed and installed at that position. The plasma CVD apparatus deposits a silicon oxide film, by plasma CVD, on the surface of the crystallized semiconductor thin film exposed from the conveyed glass substrate 1, in order to form a gate insulating film 11 as shown in FIG. 8(a) (step-8).

Then, the glass substrate 2 on which the gate insulating film 11 has been formed is conveyed to and positioned in a sputtering apparatus that deposits a conductor film 40 forming a gate electrode as shown in FIG. 8(b). For example, aluminum (Al) 40 is deposited as a gate electrode (step-9). The substrate is then conveyed to a plasma etching apparatus, where it is subjected to plasma etching using a mask consisting of a resist film 41, to form a gate electrode 12 (step-9).

The gate electrode 12 formed in the above steps is subsequently used as a mask to implant a high concentration of impurity ions into the crystallization region in order to form a source and drain regions. The impurity ions are, for example, phosphorous ions for the n-channel transistor and boron ions for the p-channel transistor. An anneal process (for example, at 600° C. for one hour) is subsequently executed in a nitrogen atmosphere to activate the impurities. A source region S and a drain region D are thus formed in the crystallization region as shown in FIG. 1. This results in a channel region C between the source region S and the drain region D in which carriers migrate (step-10).

An interlayer insulating layer (not shown) is then formed on the gate insulating layer 11 and gate electrode 12. Contact holes (not shown) are formed in the interlayer insulating layer to connect a source and drain electrodes to the source and drain regions S and D, respectively.

Then, a metal layer constituting a gate electrode, a source, and a drain electrode, for example, aluminum, is filled into the contact holes and deposited on the interlayer insulating layer (not shown). The metal layer deposited on the interlayer insulating layer is etched to a predetermined pattern using a photolithography technique. This forms a source and drain electrodes to manufacture an n- or p-channel type thin-film transistor 1 (step-11). In the first and second embodiments, the TFT 1 has a gate length of for example, 1 μm.

In the above manufacture process, the TFT is formed so that the side edge of the source region S or drain region D which is adjacent to the channel region C is placed in the crystallization region at a position that does not correspond to the crystal growth start position 7. In other words, the side edge is positioned by the gate electrode 12, acting as an ion implantation mask. The gate electrode 12 is thus placed and installed on the crystallization region at a position that does not correspond to the vicinity of the crystal growth start position 7.

Figure 3:
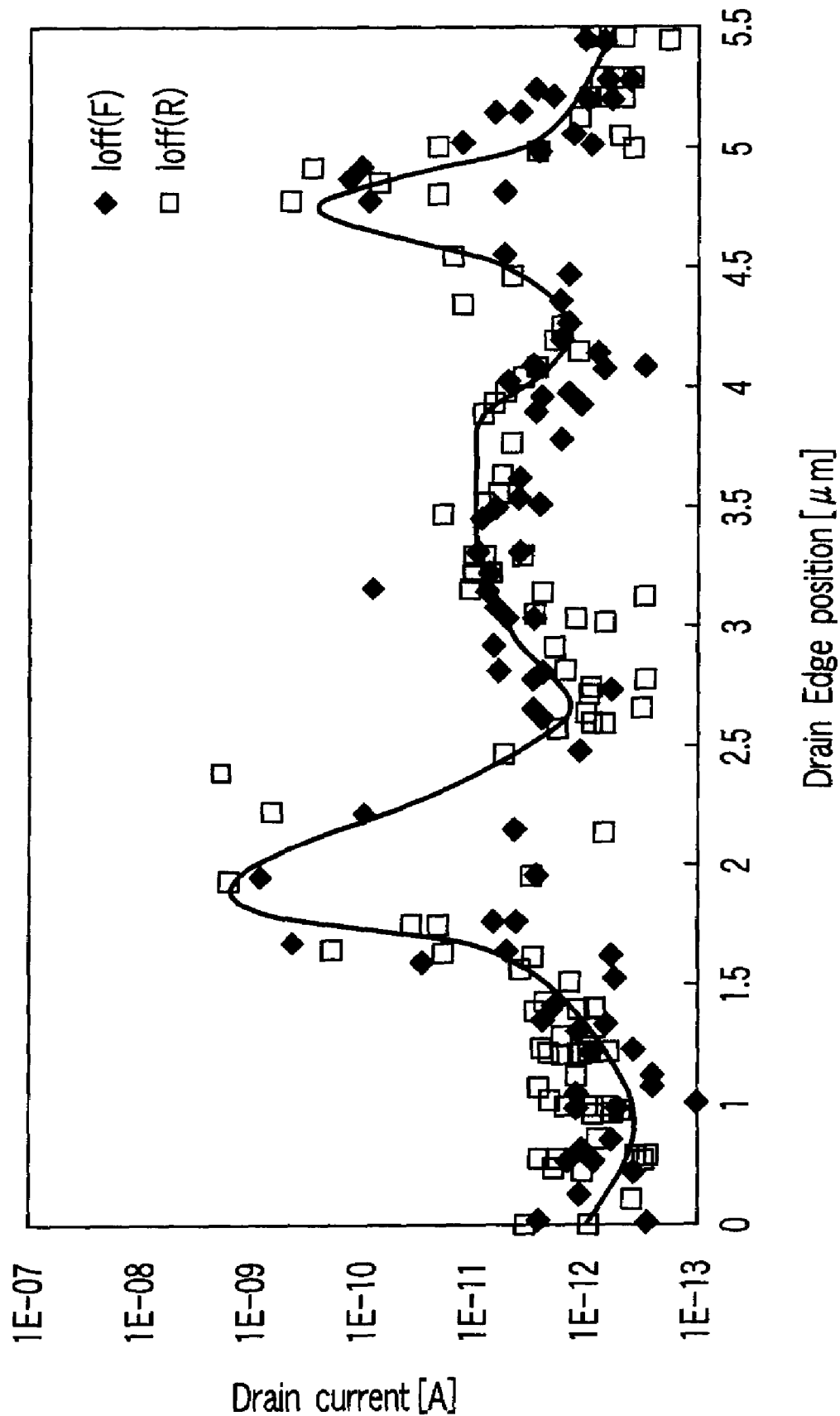
FIG. 3 is a characteristic diagram showing a mobility characteristic and an off-current characteristic vs. a drain edge position in the n-channel type thin-film transistor shown in FIG. 1.
Figure 4:
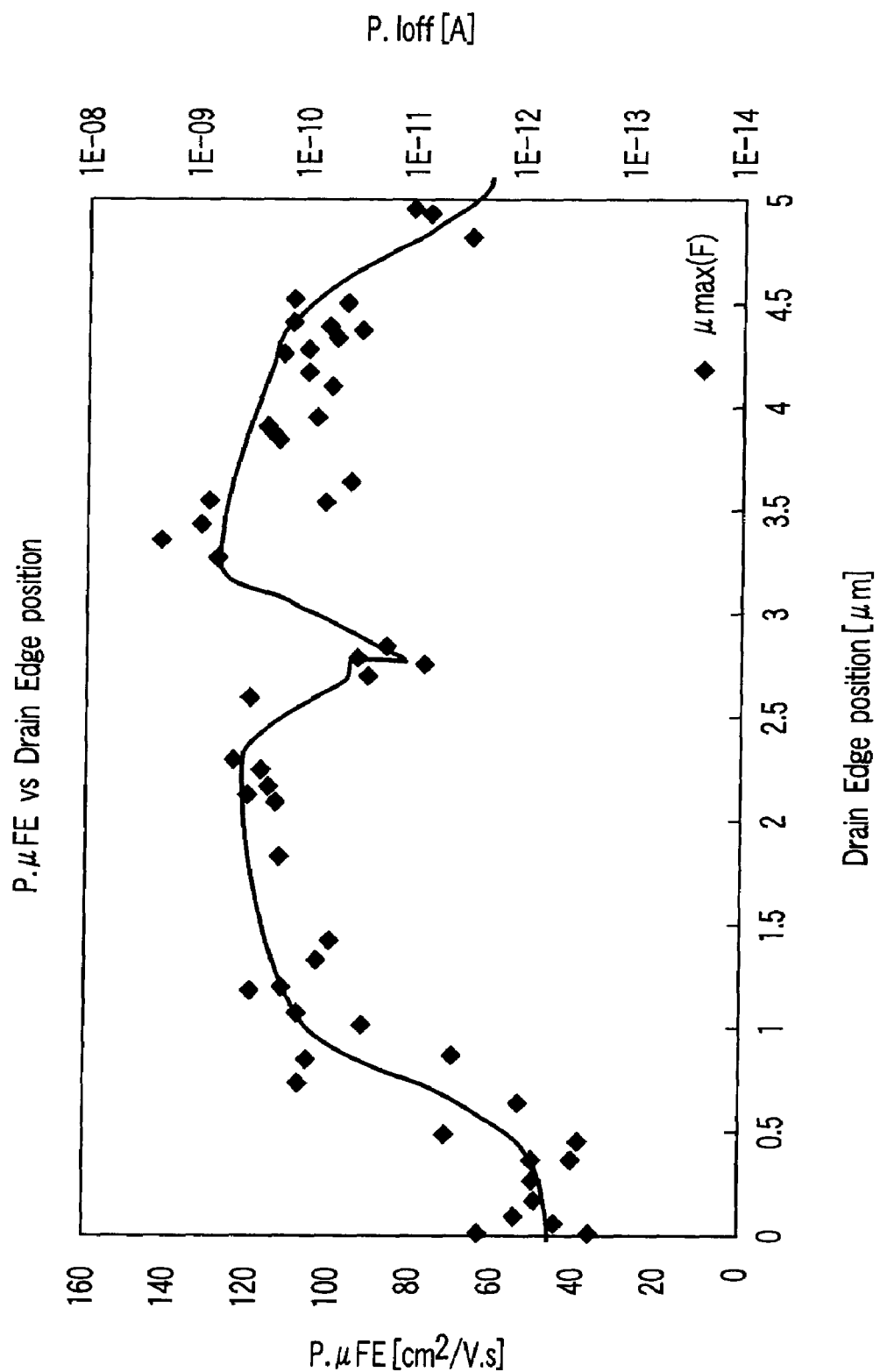
FIG. 4 is a characteristic diagram showing a mobility characteristic vs. a drain edge position in the p-channel type transistor shown in FIG. 1.

With reference to FIGS. 3 and 4, description will be given of measurements of transistor characteristics of the n- or p-channel type TFT thus manufactured.

Figure 16:
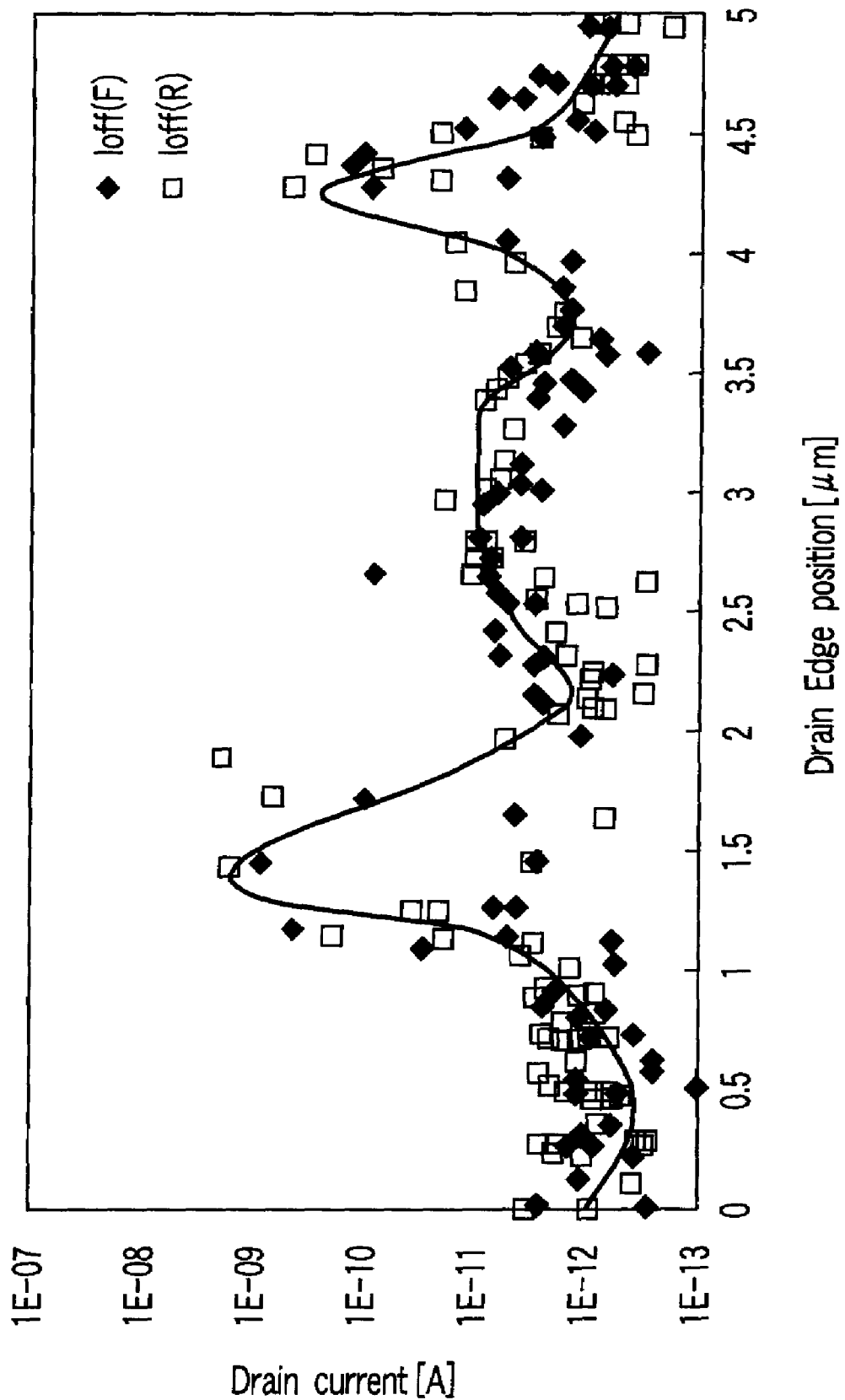
FIG. 16 is a characteristic diagram of another embodiment showing a mobility characteristic and an off-current characteristic vs. a drain edge position in the n-channel type thin-film transistor shown in FIG. 1.

FIG. 3 and FIG. 16 are characteristic curve diagrams showing the relation between thus and the off-current [A] (drain current) vs. drain edge position, in the n-channel TFT 1 formed in the crystallization region 5 crystallized as described above. FIG. 3 shows the off-current characteristic exhibited when a source-drain electrode voltage Vds=0.1 V and when a source-gate electrode voltage Vgs=−5 V.

FIG. 4 is a characteristic curve diagram showing the mobility μFE [$cm^2$/Vs] vs. drain edge position in the p-channel TFT 1 formed in the crystallization region 5 crystallized as described above. FIG. 3 shows the mobility characteristic exhibited when the source-drain electrode voltage Vds=0.1 V and when the source-gate electrode voltage Vgs=−5 V. The crystallization region depends on the pulse width of the reverse peak-like light intensity distribution. For example, a technique has been established which enables a crystallization region of 5 μm size to be mass produced.

Observations for the off-current characteristic are as follows.

A larger off-current, that is, an inappropriate off-current characteristic (a smaller off-current, that is, an appropriate off-current characteristic), is offered by TFTs 1 manufactured so that the drain edge is formed (in the crystallization region), as seen from FIG. 3, within 0.7 μm from the crystal growth start position 7, or about 2.0 to 3.8 μm or about 4.6 to 5.0 μm away from the crystal growth start position.

In another embodiment, a smaller off-current, that is, an appropriate off-current characteristic is offered by TFTs 1 manufactured so that the drain edge is formed (in the crystallization region), as seen from FIG. 16 within 1.0 μm from the crystal growth start position 7, or about 2.0 to 3.8 μm or about 4.6 to 5.0 μm away from the crystal growth start position.

A smaller off-current, that is, an appropriate off-current characteristic (a larger off-current, that is, an inappropriate off-current characteristic), is offered by n-channel type TFTs 1 manufactured so that the drain edge is formed (in the crystallization region), as seen from FIG. 3 within 0.5 μm from the crystal growth start position 7, or about 1.5 to 1.8 μm or about 3.0 to 3.7 μm away from the crystal growth start position.

In another embodiment, a larger off-current, that is, an inappropriate off-current characteristic is offered by n-channel type TFTs 1 manufactured so that the drain edge is formed about 1.0 to 2.0 μm or about 3.7 to 4.6 μm away from the crystal growth start position 7 as seen in FIG. 16.

Observations for the mobility characteristic are as follows.

As shown in FIG. 4, an appropriate mobility characteristic is offered by n-channel type TFTs 1 manufactured so that the drain edge is formed in the crystallization region about 0.7 to 2.6 μm or about 3.1 to 4.5 μm away from the crystal growth start position or vertical growth start position.

On the other hand, a reduced mobility is offered by p-channel type TFTs 1 manufactured so that the drain edge is formed within 0.7 μm from the crystal growth start position 7, or about 2.2 to 3.1 μm or about 4.7 to 5.0 μm away from the crystal growth start position 7; these TFTs are difficult to utilize.

In another embodiment, a reduced mobility is offered by p-channel type TFTs 1 manufactured so that the drain edge is formed within 0.7 μm from the crystal growth start position 7, or about 2.7 to 3.1 μm or about 4.5 to 5.0 μm away from the crystal growth start position 7; these TFTs are difficult to utilize.

Now, with reference to FIGS. 5 to 7, a specific description will be given of a crystallization apparatus that forms a shape such that crystal growth progresses in the horizontal direction from the crystal growth start position 7, where a large number of fine crystal grains are present, with the crystal rising toward the crystal growth end position 8.

Figure 5:
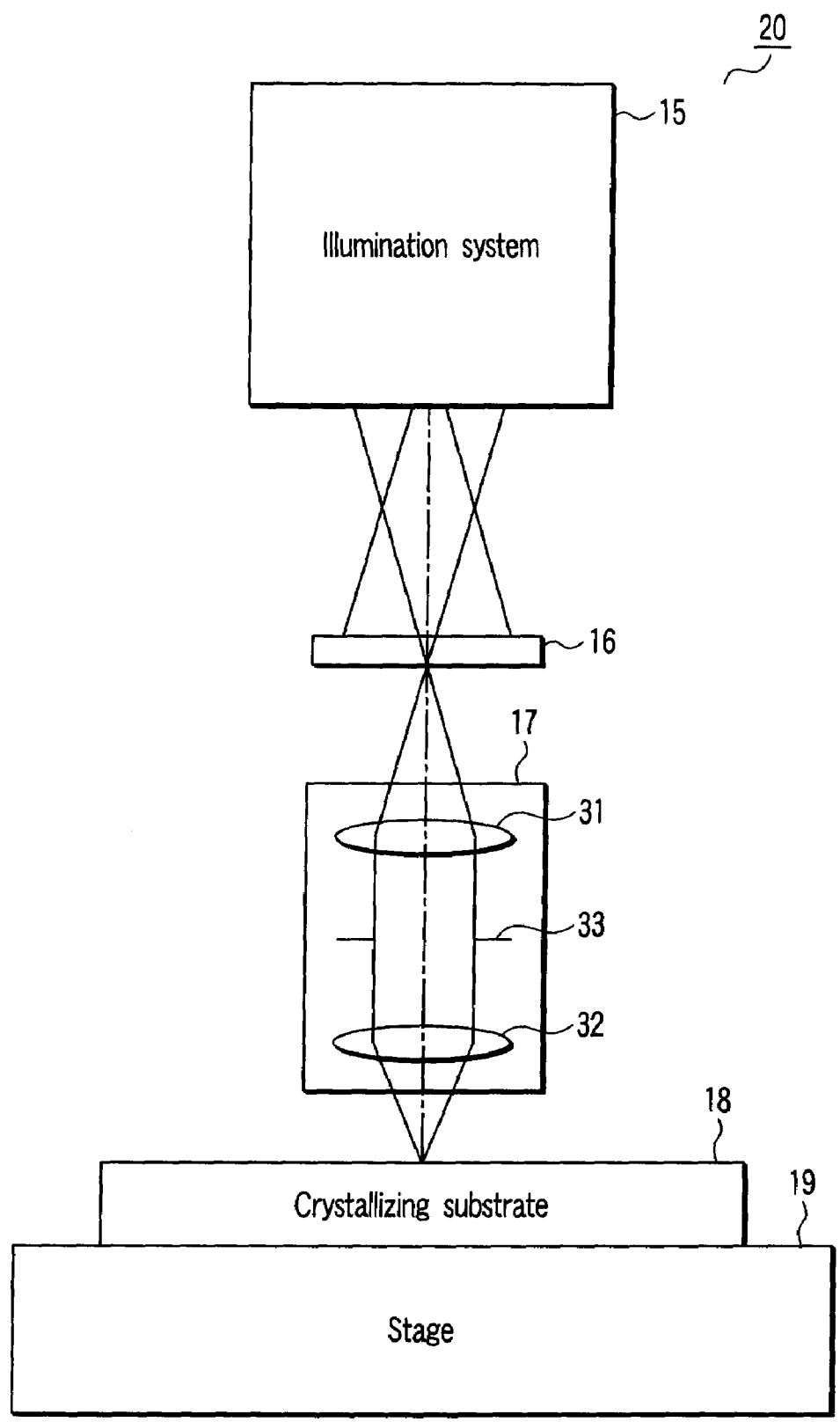
FIG. 5 is a diagram of configuration of a crystallization apparatus illustrating the crystallization process shown in FIG. 2.

As shown in FIG. 5, a crystallization apparatus 20 consists of an illumination system 15, a phase modulation element 16 provided on the optical axis of the illumination system 15, an image forming optical system 17 provided on the optical axis of the phase modulation element 16, and a stage 19 that supports a crystallizing substrate 18 provided on the optical axis of the image forming optical system 17.

Figure 6:
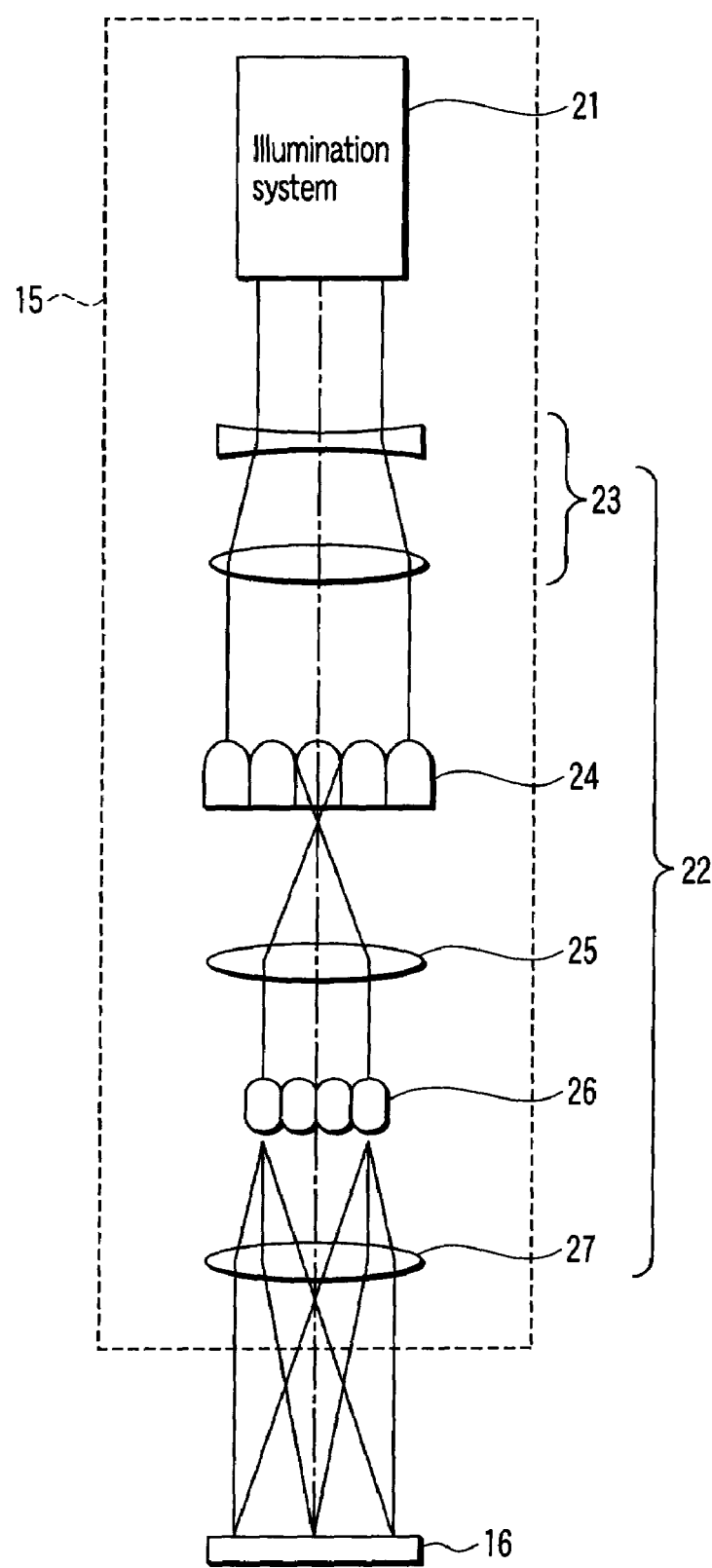
FIG. 6 is a diagram illustrating an illuminating optical system shown in FIG. 5, in further detail.
Figure 7:
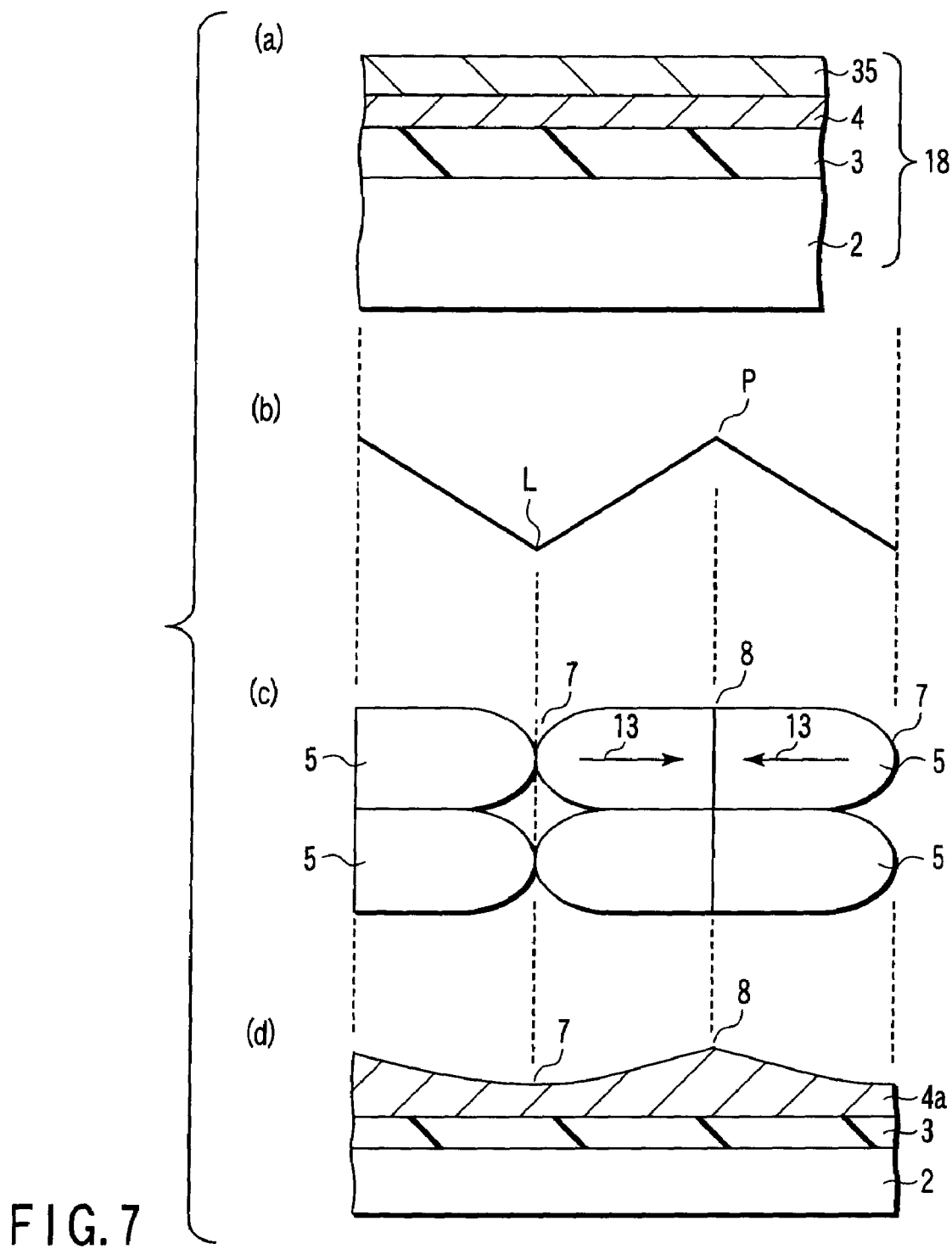
FIG. 7 is a diagram illustrating the structure of a substrate in which crystallization is carried out by the crystallization process shown in FIG. 2 and the shape of a crystallized semiconductor thin film.

The illumination system 15 is the optical system shown in FIG. 6 and consists of, for example, a light source 21 and a homogenizer 22. The light source 21 may be a KrF excimer laser light source 21 that supplies light having a wavelength of for example, 248 nm. Alternatively, the light source 21 may be a XeCl excimer laser light source that emits pulse light having a wavelength of 308 nm, a KrF excimer laser that emits pulse light having a wavelength of 248 nm, or an ArF excimer laser that emits pulse light having a wavelength of 193 nm. Alternatively, the light source 21 may be a YAG laser light source. Alternatively, the light source 21 may be another appropriate light source that outputs energy sufficient to melt the non-single-crystal semiconductor thin film, for example, the amorphous silicon film 4. The homogenizer 22 is provided on the optical axis of laser light emitted by the light source 21.

The homogenizer 22 homogenizes the light intensity of laser light emitted by the light source 21 as well as the incident angle of the light to the phase modulation element 16, in the cross section of the light flux. The homogenizer 22 has, for example, a beam expander 23, a first fly eye lens 24, a first condenser optical system 25, a second fly eye lens 26, and a second condenser optical system 27, all of which are provided on the optical axis of laser light from the light source.

In the illumination system 15, laser light is emitted by the light source 21. Then, the laser light is enlarged via the beam expander 23 and is then incident on the first fly eye lens 24. A plurality of light sources are formed on a rear focal plane of the first fly eye lens 24. A flux of light from the plurality of light sources illuminates an incident surface of the second fly eye lens 26 in a superimposing manner. As a result, more light sources are formed on the rear focal plane of the second fly eye lens 26 than on the rear focal plane of the first fly eye lens 24. A flux of light from the large number of light sources formed on the rear focal plane of the second fly eye lens 26 is incident on the phase modulation element 16 via the second condenser optical system 27. The light flux thus illuminates the phase modulation element 16 in a superimposing manner.

As a result, the first fly eye lens 24 and first condenser optical system 25 in the homogenizer 22 constitute a first homogenizer, which homogenizes the incident angle of laser light incident on the phase modulation element 16. The second fly eye lens 26 and second condenser optical system 27 constitute a second homogenizer, which homogenizes the light intensity of laser light from the first homogenizer at each position on the surface of the phase modulation element 16, the incident angle of the light having already been homogenized. The illumination system 22 thus forms laser light having an almost uniform light intensity distribution. The phase modulation element 16 is irradiated with this laser light.

The phase modulation element 16, that is, a phase shifter, is an optical element that modulates the phase of light emitted by the homogenizer 22. The phase modulation element 16 then emits laser beams having a reverse peak-like minimum light intensity distribution such as the one shown in FIG. 7(b), which is a partly enlarged view of a reverse peak-like minimum light intensity distribution. In this figure, the axis of abscissa indicates position (position on the irradiated surface), while the axis of ordinate indicates light intensity (energy).

The phase shifter 16 used as a phase modulation element can be formed by creating steps in a transparent member, for example, a quartz base material. The phase shifter 16 diffracts laser beams at the boundary between steps so that they interfere with each other, to apply a periodic spatial distribution to the laser light intensity. The phase shifter is not limited to this example. For example, a light transmission region is formed which has a lateral phase difference of 180° around the boundary corresponding to a step portion x=0. In general, when the wavelength of laser light is defined as λ and a transparent medium with a refractive index n is formed on the transparent base material, the difference t in film thickness between the transparent medium and the transparent base material required to achieve a phase difference of 180° is given by $t=\lambda/2(n-1)$. When the quartz base material has a refractive index of 1.46, since XeCl excimer laser light has a wavelength of 308 nm, a step of 334.8 nm size is required to achieve a phase difference of 180°. The step can be formed by, for example, selective etching.

Alternatively, a step portion can be formed by using an SiNx film as a transparent medium and depositing it by PECVD, LPCVD, or the like. In this case, when the SiNx film has a refractive index of 2.0, it may be deposited on the quartz base material to a thickness of 154 nm and then etched to form a step. The intensity of laser light having passed through the phase shifter with a 180° phase difference exhibits a periodic varying pattern as shown in FIG. 7(b).

In the present embodiment, the periodic phase shifter is a mask obtained by repeatedly and periodically forming steps. In the present embodiment, both the width of a phase sift pattern and the distance between patterns are, for example, 3 μm. The phase difference need not necessarily be 180° but has only to achieve a laser light intensity distribution suitable for crystallizing the semiconductor thin film.

As shown in FIG. 5, laser light having its phase modulated by the phase modulation element 16 is incident on the crystallizing substrate 18 such as an amorphous silicon film via the image forming optical system 17. The image forming optical system 17 is placed so that the pattern surface of the phase modulation element 16 is optically conjugate to the crystallizing substrate 18. In other words, the height position of the stage 19 is corrected so as to set the crystallizing substrate 18 on a surface (image surface of the image forming optical system 17) optically conjugate to the pattern surface of the phase modulation element 16.

The image forming optical system 17 comprises an aperture stop 33 between a positive lens group 31 and a positive lens group 32. The image forming optical system 17 may be an optical lens which projects an image from the phase modulation element 16, on the crystallizing substrate 18 without changing its scale or which reduces the scale to, for example, one-fifth.

The aperture stop 33, shown in FIG. 5, has a plurality of aperture stops including aperture portions (light transmission portions) with different sizes. These aperture stops 33 may be replaced with each other with respect to the optical path. Alternatively, each of the aperture stops 33 may have an iris stop that can continuously vary the size of the aperture portion. In any case, the size of the aperture in the aperture stop 33 (or the image-side numerical aperture NA of the image forming optical system 4) is set so as to generate a required light intensity distribution on the semiconductor film on the crystallizing substrate 18. The image forming optical system may be a refractive or reflective optical system or a catadioptric optical system.

As shown in FIG. 7(a), the crystallizing substrate 18 is composed of the silicon oxide film 3 as an underlayer insulating film, the amorphous silicon film 4, and the cap film 35 sequentially formed on, for example, the glass substrate 2 for a liquid crystal display by chemical vapor phase deposition process (CVD process) or a sputtering process.

The underlayer insulating film is formed of, for example, $SiO_2$ and has a film thickness of 500 to 1,000 nm. The underlayer insulating film 3 prevents the amorphous silicon film 4 from directly contacting the glass substrate 2 to mix foreign matter such as Na deposited from the glass substrate 2, into the amorphous silicon film 4. The underlayer insulating film 3 also prevents a melting heat quantity from being transferred directly to the glass substrate 2 during crystallization of the amorphous silicon film 4. The underlayer insulating film 3 effectively stores melting heat to prevent temperature from lowering fast, thus contributing to forming a large-grain-size crystal.

The amorphous silicon film 4 is to be crystallized to form a source, drain, and channel of TFT and has a film thickness of, for example, 30 to 250 nm. The cap film 35 stores heat generated when the amorphous silicon film 4 is melted during a crystallization process. This heat storage effect contributes to forming a large-grain-size crystallization region. The cap film 35 is an insulating film, for example, a silicon oxide film ($SiO_2$), and may have a film thickness of 100 to 400 nm, for example, 300 nm.

The crystallizing substrate 18 is automatically conveyed onto the stage 19 in such a crystallization apparatus as shown in FIG. 5. The crystallizing substrate 18 is then placed at a predetermined position and held by a vacuum or electrostatic chuck.

Now, the crystallization process will be described with reference to FIGS. 6 and 7. Pulse laser light emitted by the laser light source 21, shown in FIG. 6, is incident on the homogenizer 22, which homogenizes the intensity of the laser light and the incident angle of the light to the phase modulation element 16. In other words, the homogenizer 22 spreads the laser beam from the light source 21 in the horizontal direction to obtain a linear laser beam (which has, for example, a linear length of 200 mm). The homogenizer 22 further homogenizes the light intensity distribution. For example, a plurality of X-direction cylindrical lenses are arranged in a Y direction to form a plurality of light fluxes arranged in the Y direction, with other X-direction cylindrical lenses redistributing the light fluxes. Similarly, a plurality of Y-direction cylindrical lenses are arranged in the X direction to form a plurality of light fluxes arranged in the X direction, with other Y-direction cylindrical lenses redistributing the light fluxes.

The laser light may be, for example, XeCl excimer laser light with a wavelength of 308 nm. The duration of one shot pulse is, for example, 20 to 200 ns. The phase modulation element 16 is irradiated with pulse laser light under these conditions. Pulse laser beams entering the periodically formed phase modulation elements 16 are diffracted at the step portion to interfere with one another. The phase modulation element 16 thus generates a periodically varying light intensity distribution like a reverse peak pattern such as the one shown in FIG. 7(b).

In the reverse peak pattern-like light intensity distribution, laser light intensity sufficient to melt the amorphous silicon film 4 is desirably output between a minimum light intensity portion L and a maximum light intensity portion P. Pulse laser light having passed through the phase modulation element 16 is incident on the amorphous silicon film 4 while being focused on the surface of the crystallizing substrate 18 by the image forming optical system 17.

The incident pulse laser light is almost transmitted through the cap film 35 and absorbed by the amorphous silicon film 4. As a result, the irradiated region of the amorphous silicon film 4 is heated and melted. The melting heat is stored by the presence of the cap film 35 and silicon oxide film 3.

When the irradiation with pulse laser light is blocked, the temperature of the irradiated region tends to lower at high speed. In this case, the heat stored in the cap film 35 and silicon oxide film 3 serves to lower the temperature very slowly. The temperature of the irradiated region lowers in accordance with the reverse peak pattern-like light intensity distribution generated by the phase modulation element 16. This causes crystal growth to sequentially progress in the horizontal direction from the minimum light intensity portion L to the maximum light intensity portion P.

In other words, a solidification position in a melted region in the irradiated region sequentially moves from low temperature side to high temperature side. That is to say, as shown in FIGS. 7(c) and 7(d), crystal growth progresses from the crystal growth start position 7 to the crystal growth end position 8. The crystal rises slightly in the vicinity of the crystal growth end position 8 in the irradiated region as shown in FIG. 7(d). FIG. 7(c) is a plan view illustrating the shape of the crystallization region 5 in the amorphous silicon film 4 resulting from strip-off of the cap film 35. FIG. 7(c) shows how crystal growth progresses in the horizontal direction 13 from the crystal growth start position 7 to the crystal growth end position 8.

FIG. 7(d) is a sectional view of FIG. 7(c). As shown in FIG. 7(d), the film thickness of the semiconductor thin film 4a increases from the crystal growth start position 7 toward the crystal growth end position 8. The crystal has an inclined surface having a peak at the crystal growth end position 8. This sectional shape indicates that crystallization results in an angled shape having a peak at the crystal growth end position 8. FIG. 9(d) partly shows a plurality of reverse peak-like light intensity distributions as shown in FIG. 7(b). A single reverse peak-like light intensity distribution pattern results in a film thickness distribution with a pair of angled changes as well as only a pair of raised portions.

The crystallization process with pulse laser light is thus finished. The crystallization region subjected to crystal growth is large enough to house one or more functional elements. FIGS. 7(b), 7(c), and 7(D) show their mutual relationships using dotted lines. Specifically, in FIGS. 7(b), 7(c), and 7(D), crystal growth starts in the reverse peak portion L of the reverse peak-like light intensity distribution (crystal growth start position 7). The crystal growth ends in a positive peak portion P (crystal growth end position 8). The single crystal silicon film thickness sequentially increases from the crystal growth start position 7 to the crystal growth end position 8, with the crystal rising in the vicinity of the end position 8.

The crystallization apparatus 20, shown in FIG. 5, is controlled in accordance with a program pre-stored in a control device (not shown). Specifically, the crystallization apparatus 20 is controlled so that the crystallization region in the next amorphous silicon film 4 is automatically irradiated with pulse laser light. To move to the next crystallization region, for example, the stage 19 can be moved to select an irradiated position. Of course, the crystallization position can be selected by moving the crystallizing substrate 18 and the light source 21 relative to each other.

Once a new crystallizing region is selected and alignment is completed, the next pulse laser light is emitted. Repeating such a laser light shot enables the crystallizing substrate 18 to be crystallized over a wide range. The crystallization process is thus executed on the entire substrate. The amorphous silicon film 4 in which the crystallization region is formed as shown in FIG. 7(d) is called the semiconductor thin film 4a.

Figure 8:
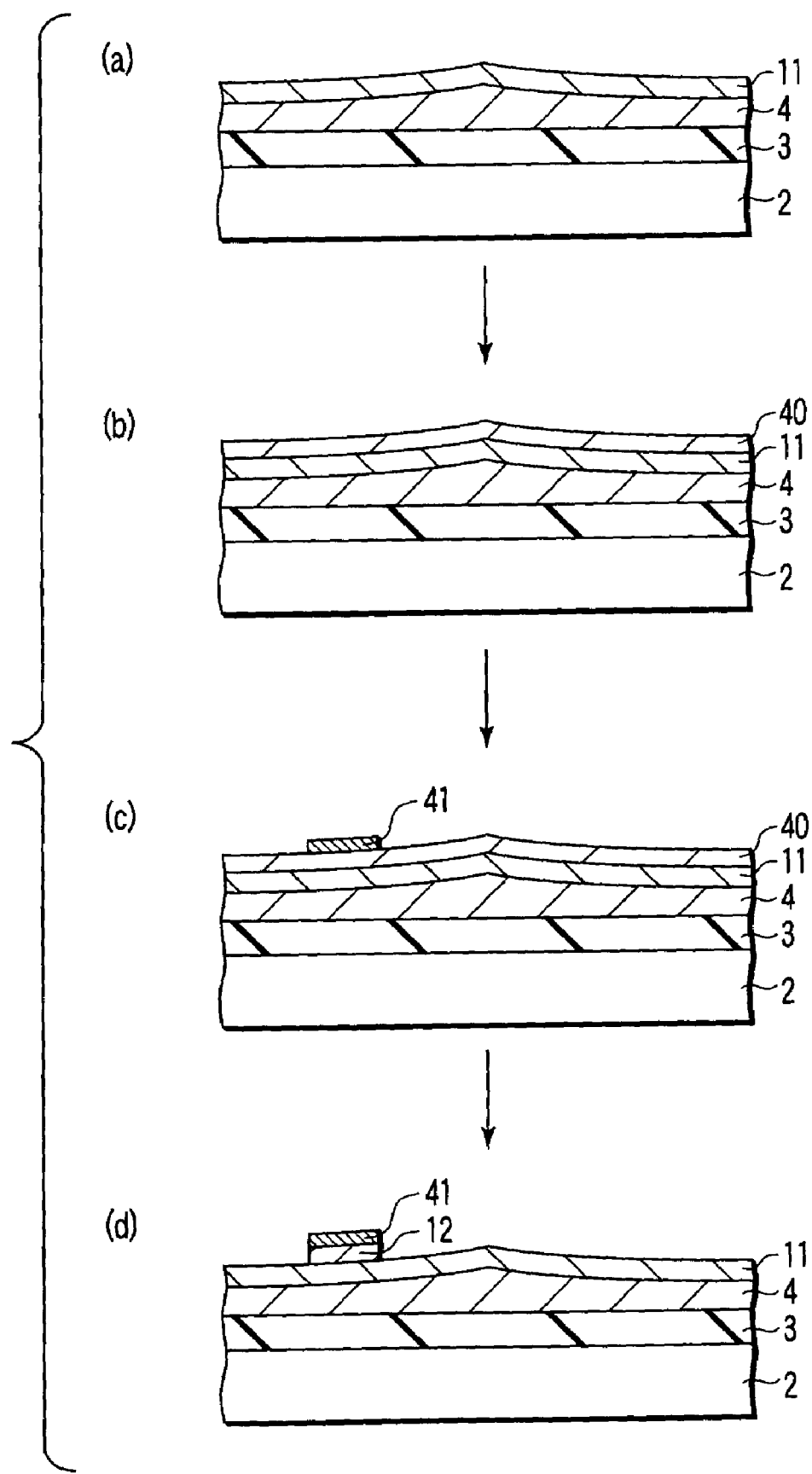
FIG. 8 is a sectional view illustrating an example of the TFT manufacturing process shown in FIG. 2, in order of the steps.
Figure 9:
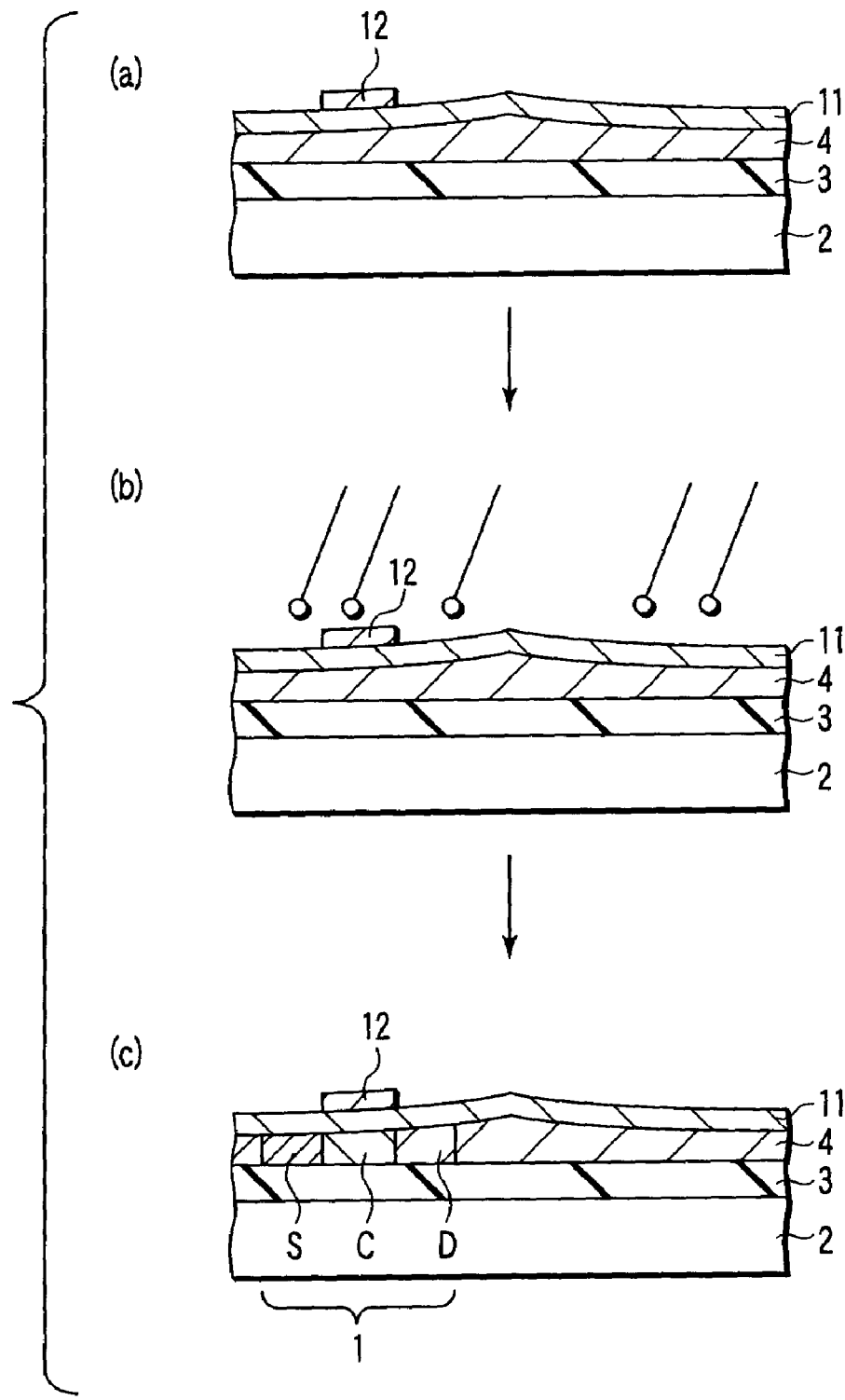
FIG. 9 is a sectional view illustrating a postprocess of the TFT manufacturing process shown in FIG. 8, in order of the steps.

Now, with reference to FIGS. 8 and 9, description will be given of an example of a part of the TFT manufacturing process which follows step-8, shown in FIG. 2. The same components as those in FIGS. 1 to 7 are denoted by the same reference numerals and their detailed description is omitted.

An $SiO_2$ film, the cap film 35, has been deposited on the surface of the substrate crystallized in the above steps. The $SiO_2$ film can also be used as a gate insulating film of the TFT. However, if foreign matter from the amorphous silicon film 4 may be mixed into the $SiO_2$ film during the crystallization process as a result of abrasion or the like, the $SiO_2$ film is preferably etched off. In the present example, the $SiO_2$ is removed.

As shown in FIG. 8(a), the gate insulating film 11, for example, an $SiO_2$ film, is deposited on the semiconductor thin film 4a, located on the surface of the substrate from which the cap film 35 has been removed. The gate insulating film 11 is a silicon oxide film deposited on the semiconductor thin film 4a by, for example, the LP-CVD process. LP-CVD is carried out under conditions including, for example, a substrate temperature of 500° C. and a deposition time of 45 minutes.

The gate electrode 12 is then formed. Specifically, as shown in FIG. 8(b), a gate electrode layer, for example, an aluminum layer 40, is deposited on the gate insulating film 11. The aluminum layer 40 is deposited on the silicon oxide film ($SiO_2$ film) of the gate insulating film 11 to a thickness of, for example, 100 nm by, for example, sputtering. The sputtering conditions include, for example, a substrate temperature of 100° C. and a deposition time of 10 minutes.

The aluminum layer 40 is selectively etched to form a gate electrode 12 at a predetermined position. To achieve this, a resist pattern 41 is formed on the aluminum layer 40. The resist pattern 41 is formed by applying a resist film to the aluminum layer 40, selectively exposing the resist film using a photomask, and then removing the resist film with a mask region for a gate electrode left. The resist pattern 41 is thus formed as shown in FIG. 8(c).

The position of the resist pattern 41 is important, which is used to form a gate electrode 12. The resist pattern 41 is formed in the crystallization region at a position that does not correspond to the vicinity of the crystal growth start position 7.

For example, the resist pattern 41 is patterned so that the source drain edge is formed in the crystallization region within 0.7 μm from the crystal growth start position 7, or about 2.0 to 3.8 μm or about 4.6 to 5.0 μm away from the crystal growth start position, for example, about 2.3 μm away from the crystallization region 5.

The aluminum layer 40 is then removed using the resist pattern 41 as a mask. For example, a dry etching process is executed to form a gate electrode 12 as shown in FIG. 8(d). The dry etching process uses, for example, $BCl_3$ or $CH_4$ as an etching gas. Subsequently, as shown in FIG. 9(e), the resist pattern 41 on the gate electrode 12 is removed.

Then, as shown in FIG. 9(f), impurities are doped into the semiconductor thin film 4a using the gate electrode 12 as a mask. As the impurities, phosphorous ions are implanted into the semiconductor thin film 4a if the TFT 1 of the present invention is of the n-channel type. Boron ions are implanted into the semiconductor thin film 4a if the TFT 1 of the present invention is of the p-channel type. For example, a logic circuit such as a CMOS inverter is composed of a combination of an n-channel type TFT and a p-channel type TFT.

That is to say, the first and second embodiments are combined together. Thus, ion implantation for forming one of an n- and p-channel type TFTs is carried out with the semiconductor thin film 4a in the other TFT covered using a mask such as a resist which inhibits unwanted ion implantation.

After the ions are implanted into the n- and p-channel type TFTs 1, an annealing process is executed to activate the impurities such as phosphorous or boron which have been implanted into the semiconductor thin film 4a. The annealing process is executed by a 3-hour thermal process at a substrate temperature of, for example, 600° C. in a nitrogen atmosphere. As a result, as shown in FIG. 9(g), the source S and drain D regions both having a high concentration of impurities are formed in the semiconductor thin film 4a on the opposite sides of the gate electrode 12.

As a result, the side edge 10 of the source S or drain D region which is adjacent to the channel region C is formed so as to lie at the appropriate position as shown in FIG. 1.

An interlayer insulating film (not shown) is then formed on the gate insulating film 11 and gate electrode 12. A well-known process is used to form a source electrode, a drain electrode, a gate electrode (not shown), and the like via through-holes (not shown) formed in the interlayer insulating film. Such a method can be used to form the TFT 1.

Figure 10:
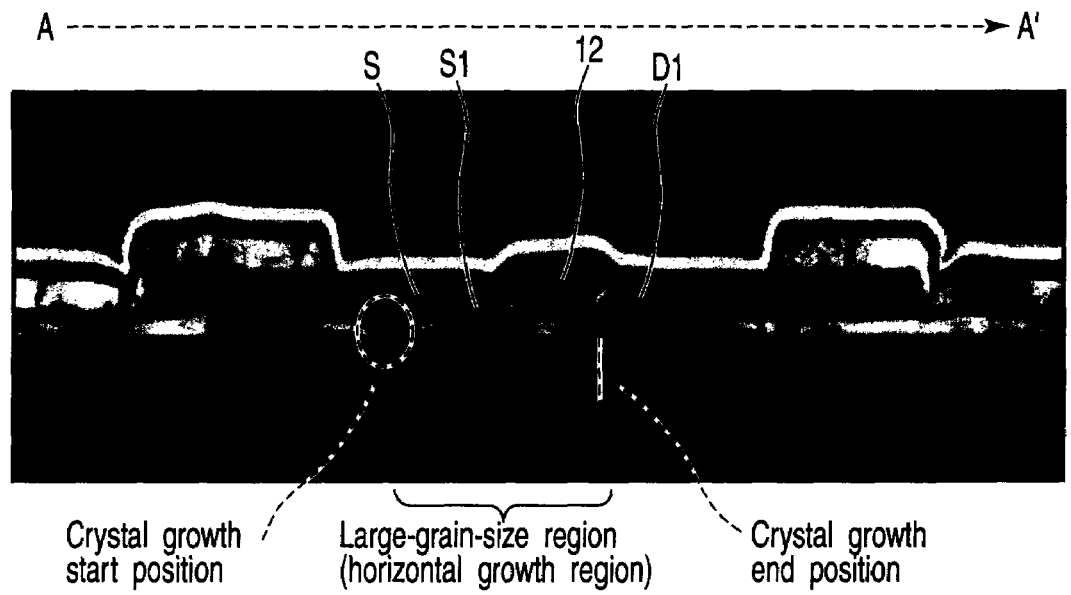
FIG. 10 is a sectional photograph of FIG. 9(g)

FIG. 10 shows a microscopic photograph of sectional structure of the TFT 1 manufactured as described above. The side edge 10 of the drain region D is provided in the vicinity of the crystal growth end position 8 in the crystallization region. FIG. 10 shows that lamination defects S1 and D1 have occurred in the source S and drain D regions in the TFT and run from a deeper portion toward a shallower portion of the semiconductor thin film 4a. FIG. 10 further clearly shows that the gate electrode 12 is inclined.

Figure 11:
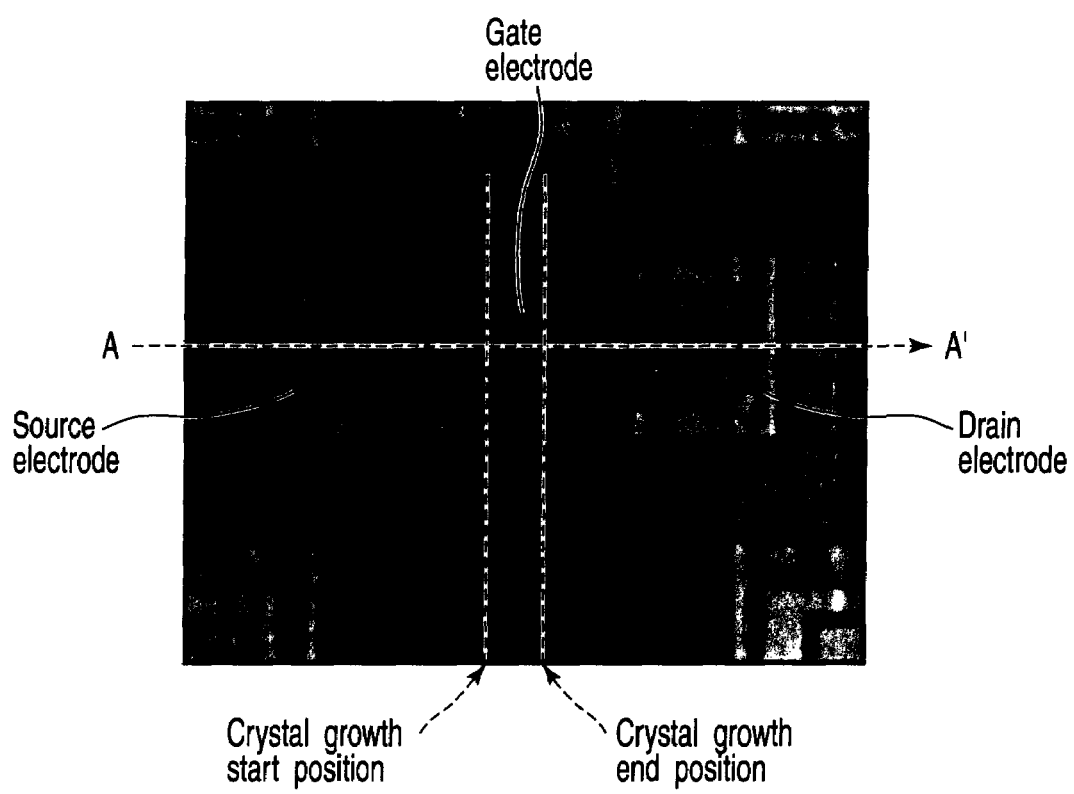
FIG. 11 is a photograph of FIG. 10 as viewed from above.

FIG. 11 is a plan view of FIG. 10. FIG. 11 shows that the side edge 10 of the drain region D which is adjacent to the channel region C is provided in the vicinity of the crystal growth end position 8.

Figure 12:
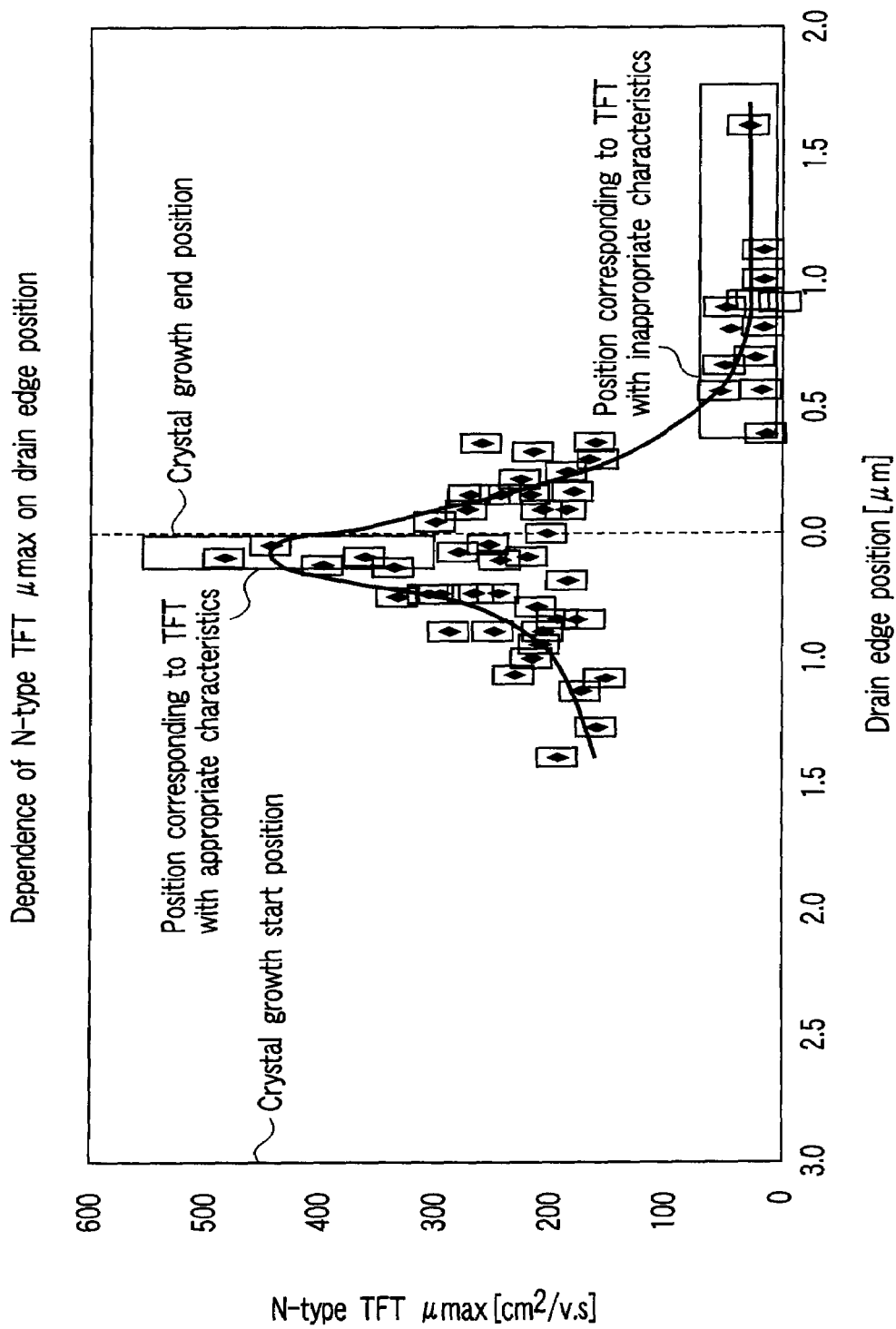
FIG. 12 is a characteristic diagram showing a comparison of characteristics of a large number of TFTs obtained by the processes shown in FIGS. 8 and 9.

FIG. 12 shows the relationship between the position of the side edge 10 the drain region D in an n-channel type thin-film transistor which edge is adjacent to the channel region C and the electron mobility μ of the n-type TFT; the side edge position is indicated on the axis of abscissa, while the electron mobility is indicated on the axis of ordinate.

Figure 17:
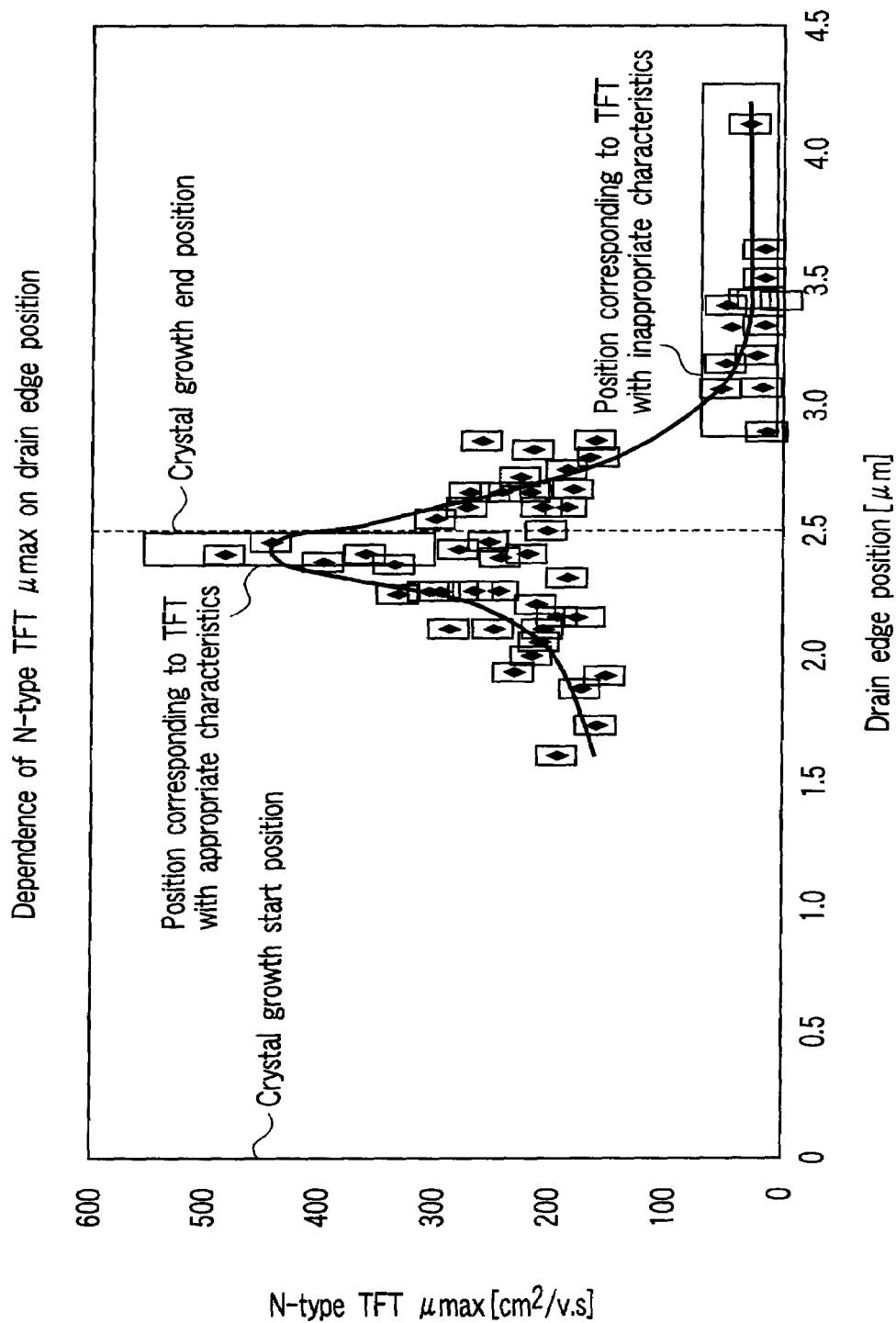
FIG. 17 is a characteristic diagram of another embodiment showing a comparison of characteristics of a large number of TFTs obtained by the processes shown in FIGS. 8 and 9.

FIG. 12 and FIG. 17 are plot of mobility characteristics of a large number of n-type TFTS. These mobility characteristics are offered by n-type TFTs in which the drain edge (channel region side edge of the drain region D) is formed within 1.5 μm from the crystal growth end position 8. The characteristics plotted with rectangles indicate the mobility characteristics of n-type TFTs in which the source edge (channel region side edge of the source region S) is formed within 1.5 μm from the crystal growth end position 8. The mobility characteristics are determined from a characteristic curve diagram showing the gate voltage (abscissa) vs. the drain current (ordinate). When the edge in the TFT is formed within 1.5 μm from the crystal growth end position 8, the characteristic offered is almost the same regardless of whether the edge belongs to the drain or source region.

Figure 2:
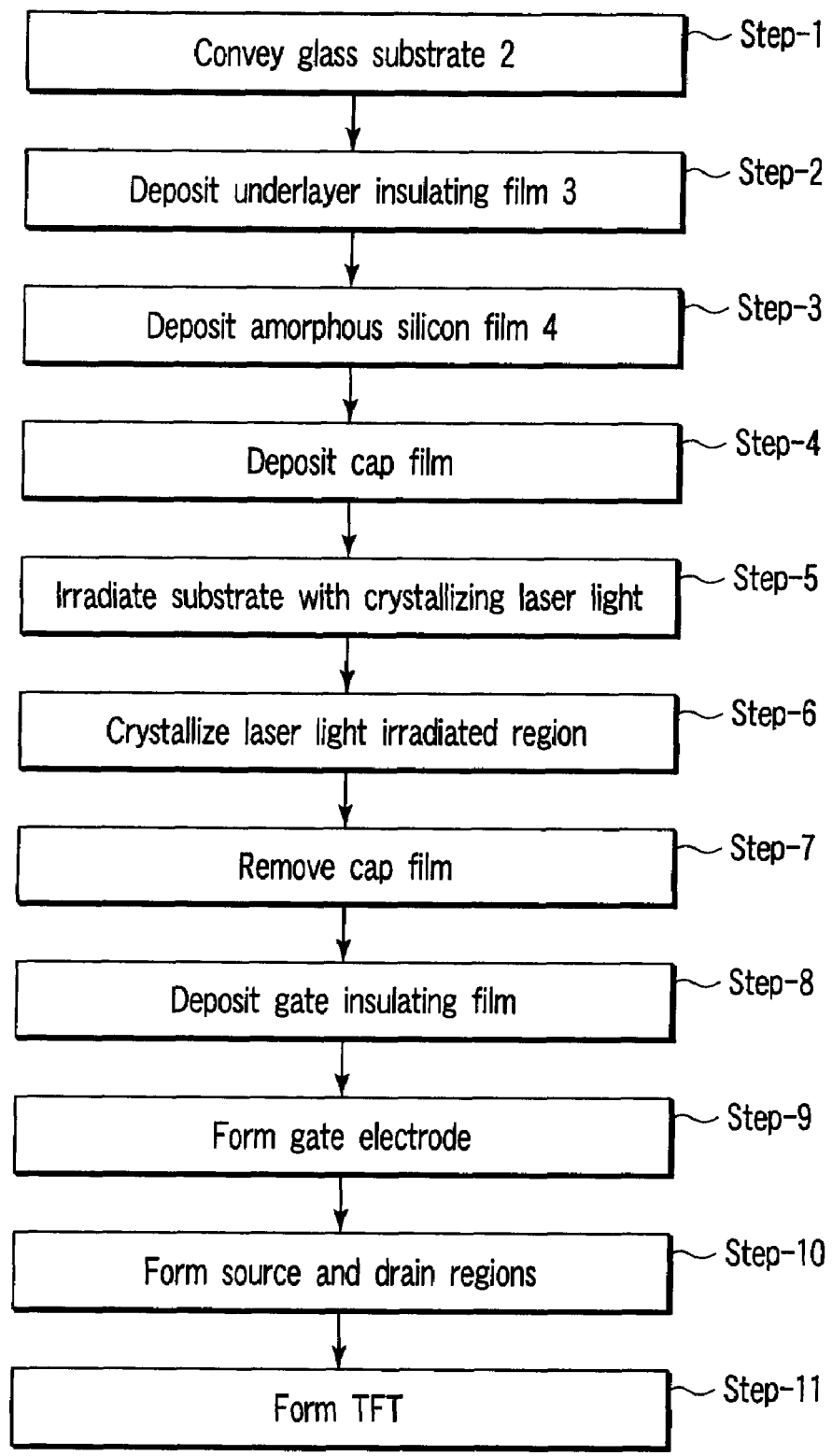
FIG. 2 is a process diagram illustrating a process of manufacturing a TFT shown in FIG. 1, in order of the steps.

As shown in FIG. 2, a mobility of 150 cm$^2$/v·s is offered by TFTs 1 in which the edge 10 of the drain region D which is adjacent to the channel region C is formed within 1.5 μm from the crystal growth end position 8. In particular, an excellent characteristic, that is, a mobility of 150 cm$^2$/v·s is offered by TFTs 1 in which the edge 10 of the drain region D which is adjacent to the channel region C is formed within 0.05 to 0.2 μm from the crystal growth end position 8.

In FIG. 12, data plotted far away from the crystal growth end position 8 (in the vicinity of the next crystallization region end position 8) indicates the characteristic of TFTs in which the channel region is formed across the crystal growth end position 8. The characteristics shown in FIG. 12 are offered by the n-type TFTs but can be obtained from p-type TFTs. Moreover, in the TFT 1 in the present example, a current flows parallel to the direction of the crystal growth, that is, the horizontal direction. It is optimum to pass current in the direction of crystal growth.

Now, with reference to FIG. 13, description will be given of an example in which TFTs according to the present invention are applied to a transistor circuit in a display, for example, a liquid crystal display.

Figure 13:
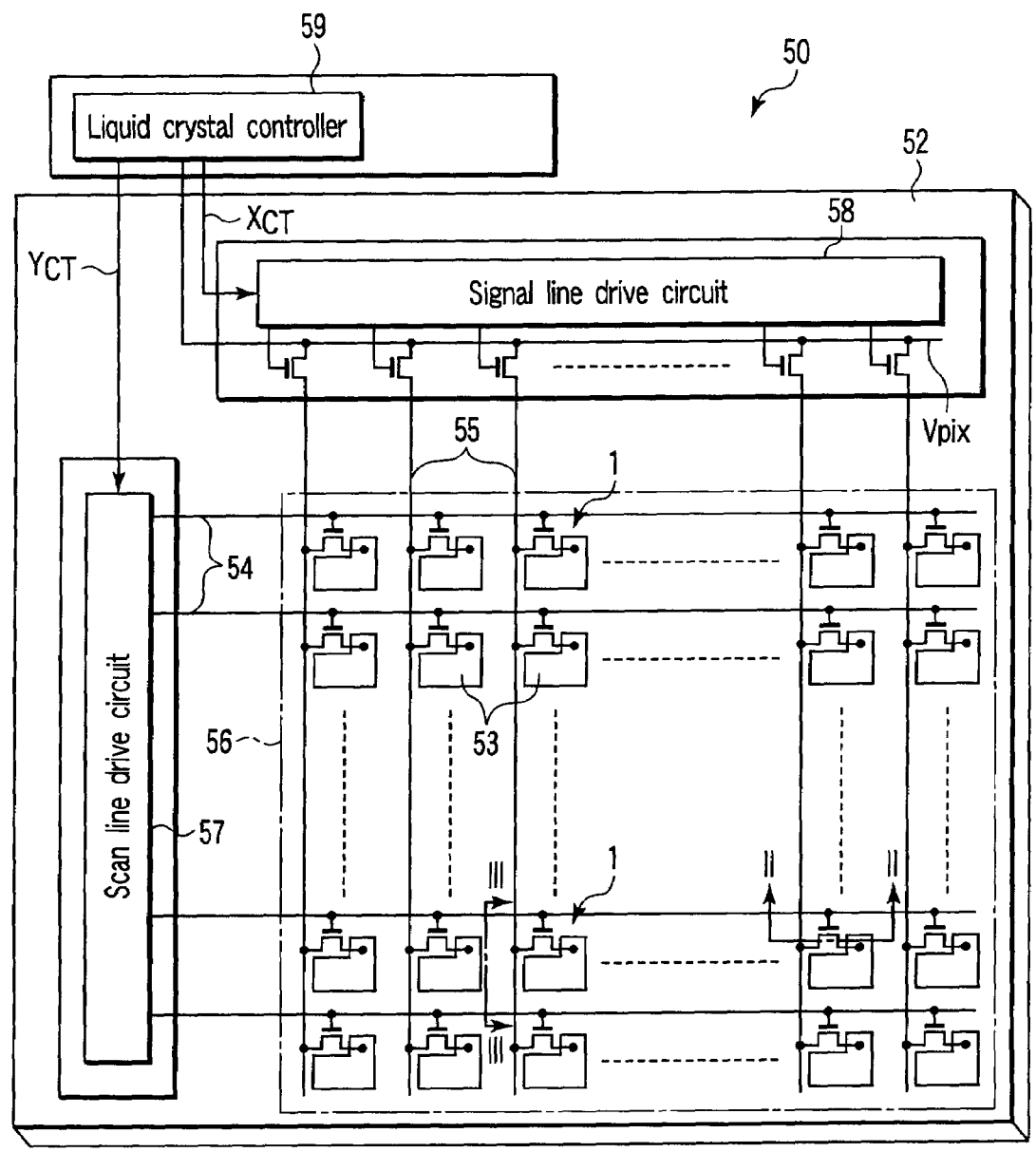
FIG. 13 is a circuit diagram illustrating an example to which the thin-film transistor in FIG. 1 is applied to a liquid crystal display.

FIG. 13 shows an example of a display section of an active matrix type liquid crystal display 50 comprising a transparent substrate 52, pixel electrodes 53, scan lines 54, signal lines 55, counter electrodes 56, TFTs 1, a scan line drive circuit 57, a signal line drive circuit 58, and a liquid crystal controller 59.

The above thin-film transistors constitute a peripheral circuit section including the scan line drive circuit 57 and signal line drive circuit 58 and which needs to operate at high speed. This display can implement a system display including active elements for the peripheral circuit section, a memory circuit section, and the like.

The TFT 1 according to the present invention is formed to have such a structure as described with reference to FIG. 1. The TFT 1 according to the present invention is applicable to the peripheral circuit section that needs to operate at high speed. For example, the TFT 1 according to the present invention is utilized as a TFT element constituting the scan line drive circuit 57, the signal line drive circuit 58, or the like. The peripheral circuit section including the scan line drive circuit 57 and signal line drive circuit 58 is desirably composed of TFTs in which the source edge of the source region S or the drain edge of the drain region D is formed within 0.05 to 0.2 μm from the crystal growth end position 8. The formation of such TFTs enables the peripheral circuits to be composed of TFTs with excellent characteristics including a mobility (μmax) of at least 300 cm$^2$/V·s.

A thus manufactured display can implement a system display including active elements for the peripheral circuit section, a memory circuit section, and the like. This display is also effective in reducing the size and weight.

Figure 14:
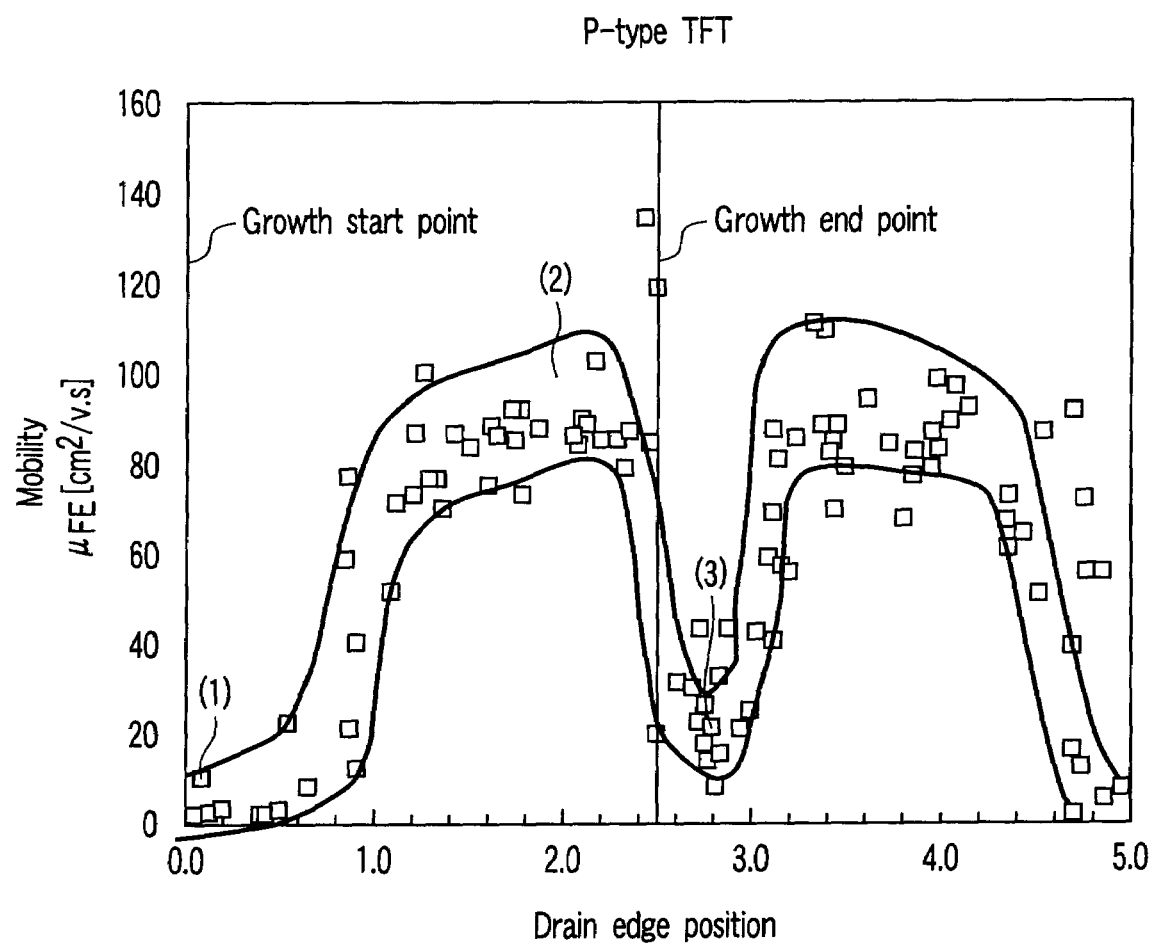
FIG. 14 is a diagram showing the mobility vs. drain edge position in a large number of p-channel transistors.

Now, another example of TFTs will be described with reference to FIGS. 14 and 15. FIG. 14 shows an example of the mobility characteristic vs. the drain edge position in the p-channel type TFT. As shown in this figure, the mobility starts to increase when the drain edge is positioned about 1 μm away from the crystal growth start position and continuously increases while the drain edge is positioned between 1 and 2.3 μm from the crystal growth start position. This characteristic is offered when the length between the crystal growth start position 7 and crystal growth end position 8 is 2.5 μm.

FIG. 15 shows a characteristic curve diagram showing the drain current vs. gate voltage in TFTs in which the drain edge is formed (1) in the vicinity of the crystal growth start position, (2) at the optimum position for the mobility, or (3) in the vicinity of the crystal growth end position. As shown in FIG. 15, the optimum characteristic is offered at the optimum position for the mobility (2). FIGS. 14 to 15 share the relationship among the position (1) in the vicinity of the crystal growth start position and the position (2) at the optimum position for the mobility and the position (3) in the vicinity of the crystal growth end position.

The thin-film transistors shown in FIG. 1 can constitute the thin-film transistors 1 in each circuit and a memory, a capacitor, a resistor, and the like which are composed of thin-film transistors as required. In other words, in the present specification, the term "thin-film transistor" includes what can be composed of the thin-film transistors shown in FIG. 1 apart from its functions.

The thin-film transistor thus manufactured is applicable to a drive circuit for a liquid crystal display or an μL (Electroluminescent) display, or an integrated circuit for a memory (SRAM or DRAM) or CPU in each pixel circuit.

As described above, the above embodiments provide TFTs having a high electron or hole mobility. TFTs exhibiting such a high mobility are applicable to the peripheral circuit section including the scan line drive circuit 57 and the signal line drive circuit 58. The present invention provides TFTs offering an appropriate off-current characteristic, which are also applicable to the peripheral circuit section including the scan line drive circuit 57 and the signal line drive circuit 58.

The several embodiments of the present invention have been illustrated and described. The embodiments of the present invention described in the present specification are only illustrative and can obviously be varied without departing from the scope of the present invention.

What is claimed is:

1. A method for manufacturing an n-channel type thin-film transistor, the method comprising:
   a step of irradiating a non-single-crystal semiconductor film with laser light having a reverse peak-like light intensity distribution to crystallize an irradiated region to form a crystallization region; and
   a step of forming a thin-film transistor by positioning a side edge of a drain or source region which is adjacent to a channel region, in the crystallization region within about 0.5 μm from a crystal growth start position or vertical growth start position, within about 1.0 μm from the crystal growth start position, or about 2.0 to 3.8 μm or about 4.6 to 5.0 μm away from the crystal growth start position.

2. A method for manufacturing a p-channel type thin-film transistor, the method comprising:
- a step of irradiating a non-single-crystal semiconductor film with laser light having a reverse peak-like light intensity distribution to crystallize an irradiated region to form a crystallization region; and
- a step of forming a thin-film transistor by positioning a side edge of a drain or source region which is adjacent to a channel region, in the crystallization region 0.7 to 2.6 μm or 3.1 to 4.5 μm away from a crystal growth start position or vertical growth start position.

3. The method for manufacturing a thin-film transistor according to claim 1, wherein the non-single-crystal semiconductor film is formed on a surface of a glass substrate, and a cap film having a heat storage effect is deposited on a top surface of the non-single-crystal semiconductor film being a film which allows the laser light to enter through the cap film.

4. The method for manufacturing a thin-film transistor according to claim 2, wherein the non-single-crystal semiconductor film is formed on a surface of a glass substrate, and a cap film having a heat storage effect is deposited on a top surface of the non-single-crystal semiconductor film being a film which allows the laser light to enter through the cap film.

5. The method for manufacturing a thin-film transistor according to claim 1, wherein the intensity of laser light having a reverse peak-like light intensity distribution corresponds to the intensity of a periodically varying light intensity distribution having a reverse peak pattern.

6. The method for manufacturing a thin-film transistor according to claim 2, wherein the intensity of laser light having a reverse peak-like light intensity distribution corresponds to the intensity of a periodically varying light intensity distribution having a reverse peak pattern.

7. The method for manufacturing a thin-film transistor according to claim 1, wherein a position of the crystallization region is selected by moving the non-single-crystal semiconductor film and a laser light source relative to each other.

8. The method for manufacturing a thin-film transistor according to claim 2, wherein a position of the crystallization region is selected by moving the non-single-crystal semiconductor film and a laser light source relative to each other.

9. The method for manufacturing a thin-film transistor according to claim 1, wherein the thin-film transistor is formed such that a current flows parallel to the direction of the crystal growth.

10. The method for manufacturing a thin-film transistor according to claim 2, wherein the thin-film transistor is formed such that a current flows parallel to the direction of the crystal growth.

* * * * *